US010797666B2

(12) United States Patent
Li et al.

(10) Patent No.: US 10,797,666 B2
(45) Date of Patent: Oct. 6, 2020

(54) PORT VELOCITY LIMITER FOR VENTED BOX LOUDSPEAKERS

(71) Applicant: Samsung Electronics Co., Ltd., Suwon-si, Gyeonggi-do (KR)

(72) Inventors: Yuan Li, Northridge, CA (US); Pascal M. Brunet, Pasadena, CA (US)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/391,081

(22) Filed: Apr. 22, 2019

(65) Prior Publication Data

US 2020/0083853 A1      Mar. 12, 2020

Related U.S. Application Data

(60) Provisional application No. 62/727,877, filed on Sep. 6, 2018.

(51) Int. Cl.
*H03G 3/30* (2006.01)
*H04R 1/02* (2006.01)
(Continued)

(52) U.S. Cl.
CPC .......... *H03G 3/3005* (2013.01); *H04R 1/025* (2013.01); *H04R 1/2826* (2013.01); *H04R 3/00* (2013.01);
(Continued)

(58) Field of Classification Search
CPC .......... H03G 3/3005; H03G 2201/103; H04R 1/025; H04R 1/2826; H04R 3/00; H04R 2201/028
(Continued)

(56) References Cited

U.S. PATENT DOCUMENTS

| 4,157,741 A | 6/1979 | Goldwater et al. |
| 4,381,831 A | 5/1983 | Putnam et al. |

(Continued)

FOREIGN PATENT DOCUMENTS

| CN | 107872759 A | 4/2018 |
| EP | 0548836 B1 | 6/1997 |

(Continued)

OTHER PUBLICATIONS

International Search Report and Written Opinion dated Dec. 23, 2019 for International Application PCT/KR2019/011591 from Korean Intellectual Property Office, pp. 1-9, Republic of Korea.

(Continued)

*Primary Examiner* — William A Jerez Lora
(74) *Attorney, Agent, or Firm* — Sherman IP LLP; Kenneth L. Sherman; Hemavathy Perumal

(57) ABSTRACT

One embodiment provides a method comprising determining an energy stored in a port of a vented box loudspeaker based on a physical model of the vented box loudspeaker, determining a time-varying attenuation to apply to a source signal for reproduction via the vented box loudspeaker based on the energy stored in the port, and controlling the energy stored in the port in real-time by attenuating the source signal based on the time-varying attenuation. A velocity of air in the port during the reproduction of the source signal is limited based on the controlling.

20 Claims, 12 Drawing Sheets

(51) Int. Cl.
  *H04R 1/28* (2006.01)
  *H04R 3/00* (2006.01)
(52) U.S. Cl.
  CPC . *H03G 2201/103* (2013.01); *H04R 2201/028* (2013.01)
(58) Field of Classification Search
  USPC ...................................... 381/94.8, 104, 108
  See application file for complete search history.

(56) References Cited

U.S. PATENT DOCUMENTS

| | | | |
|---|---|---|---|
| 4,580,655 A | 4/1986 | Keele, Jr. et al. | |
| 5,600,718 A | 2/1997 | Dent | |
| 5,870,484 A | 2/1999 | Greenberger et al. | |
| 6,028,947 A | 2/2000 | Faraone et al. | |
| 6,059,926 A | 5/2000 | Hiroshima | |
| 6,275,592 B1 | 8/2001 | Vartiainen | |
| 20,040,028 | 2/2004 | Kitamura | |
| 7,013,011 B1* | 3/2006 | Weeks .................. | H03G 9/005 381/107 |
| 7,024,014 B1 | 4/2006 | Noll | |
| 7,197,443 B2 | 3/2007 | Manrique et al. | |
| 7,348,908 B2 | 3/2008 | Slavin | |
| 7,359,519 B2 | 4/2008 | Lee et al. | |
| 7,372,966 B2 | 5/2008 | Bright | |
| 7,467,071 B2 | 12/2008 | Manrique et al. | |
| 7,477,751 B2 | 1/2009 | Lyon et al. | |
| 7,686,129 B2 | 3/2010 | Delgado, Jr. | |
| 7,688,984 B2 | 3/2010 | De Callafon | |
| 8,073,149 B2 | 12/2011 | Kuze | |
| 8,086,956 B2 | 12/2011 | Ting et al. | |
| 8,130,994 B2 | 3/2012 | Button et al. | |
| 8,146,989 B2 | 4/2012 | Godiska et al. | |
| 8,204,210 B2 | 6/2012 | van de Laar et al. | |
| 8,300,837 B2 | 10/2012 | Shmunk | |
| 8,391,498 B2 | 3/2013 | Potard | |
| 8,538,040 B2 | 9/2013 | Kirn | |
| 8,548,184 B2 | 10/2013 | Werner et al. | |
| 8,577,047 B2 | 11/2013 | Gautama | |
| 8,712,065 B2 | 4/2014 | Solgaard et al. | |
| 8,855,322 B2 | 10/2014 | Ryu et al. | |
| 8,938,084 B2 | 1/2015 | Arai | |
| 9,042,561 B2 | 5/2015 | Gautama et al. | |
| 9,130,527 B2 | 9/2015 | Potard | |
| 9,154,101 B2 | 10/2015 | Dhuyvetter | |
| 9,161,126 B2 | 10/2015 | Su et al. | |
| 9,374,634 B2* | 6/2016 | Macours .................. | H04R 1/02 |
| 9,432,771 B2 | 8/2016 | Oyetunji et al. | |
| 9,553,554 B2 | 1/2017 | Kimura et al. | |
| 9,578,416 B2 | 2/2017 | Gautama et al. | |
| 9,635,454 B2 | 4/2017 | Larrien | |
| 9,661,428 B2 | 5/2017 | Holladay et al. | |
| 9,693,148 B1 | 6/2017 | Lopez et al. | |
| 9,813,812 B2 | 11/2017 | Berthelsen et al. | |
| 9,837,971 B2 | 12/2017 | Luo et al. | |
| 9,883,305 B2 | 1/2018 | Risberg et al. | |
| 9,900,690 B2 | 2/2018 | Risberg et al. | |
| 9,924,249 B2 | 3/2018 | Sprinkle et al. | |
| 9,967,652 B2 | 5/2018 | Baird et al. | |
| 9,980,068 B2* | 5/2018 | Berthelsen ........... | H04R 29/001 |
| 9,992,571 B2 | 6/2018 | Hu | |
| 10,219,090 B2 | 2/2019 | Adams et al. | |
| 10,382,860 B2 | 8/2019 | Spillmann et al. | |
| 10,542,361 B1 | 1/2020 | Lazar et al. | |
| 2002/0141098 A1 | 10/2002 | Schlager | |
| 2003/0076875 A1 | 4/2003 | Oates | |
| 2003/0076975 A1 | 4/2003 | Stead et al. | |
| 2004/0028242 A1 | 2/2004 | Kitamura | |
| 2005/0122166 A1 | 6/2005 | Premakanthan et al. | |
| 2006/0274904 A1 | 12/2006 | Lashkari | |
| 2007/0098190 A1 | 5/2007 | Song et al. | |
| 2008/0175397 A1* | 7/2008 | Holman .................. | H04R 3/08 381/55 |
| 2009/0180636 A1 | 7/2009 | Su et al. | |
| 2010/0092004 A1 | 4/2010 | Kuze | |
| 2012/0203526 A1 | 8/2012 | Bai et al. | |
| 2012/0288118 A1 | 11/2012 | Gautama et al. | |
| 2012/0289809 A1 | 11/2012 | Kaib et al. | |
| 2013/0094657 A1 | 4/2013 | Brammer et al. | |
| 2014/0051483 A1 | 2/2014 | Schoerkmaier | |
| 2014/0254827 A1 | 9/2014 | Bailey et al. | |
| 2014/0286500 A1 | 9/2014 | Iwamoto et al. | |
| 2015/0010168 A1 | 1/2015 | Cheng et al. | |
| 2015/0010171 A1 | 1/2015 | Pernici et al. | |
| 2015/0208175 A1 | 7/2015 | Pinkerton et al. | |
| 2015/0281844 A1 | 10/2015 | Stabile | |
| 2015/0319529 A1 | 11/2015 | Klippel et al. | |
| 2016/0134982 A1 | 5/2016 | Iyer | |
| 2016/0360331 A1 | 12/2016 | Yeh | |
| 2016/0366515 A1* | 12/2016 | Mendes .................. | H04R 3/04 |
| 2016/0373858 A1 | 12/2016 | Lawrence et al. | |
| 2017/0055067 A1 | 2/2017 | Moro et al. | |
| 2017/0188150 A1 | 6/2017 | Brunet et al. | |
| 2017/0272045 A1 | 9/2017 | Chadha | |
| 2017/0280240 A1 | 9/2017 | Hu | |
| 2017/0318388 A1 | 11/2017 | Risberg et al. | |
| 2017/0325019 A1 | 11/2017 | Bezzolla et al. | |
| 2017/0345438 A1 | 11/2017 | Thyssen | |
| 2018/0014120 A1* | 1/2018 | Lawrence ............. | H04R 3/007 |
| 2018/0034430 A1 | 2/2018 | Ahmed et al. | |
| 2018/0054671 A1 | 2/2018 | Voishvillo et al. | |
| 2018/0192192 A1 | 7/2018 | Brunet et al. | |
| 2018/0206049 A1* | 7/2018 | Wendell ................ | H04R 19/04 |
| 2019/0222939 A1 | 7/2019 | Brunet et al. | |
| 2019/0281385 A1 | 9/2019 | Brunet et al. | |
| 2020/0077180 A1 | 3/2020 | Bezzola | |

FOREIGN PATENT DOCUMENTS

| | | |
|---|---|---|
| EP | 1799013 B1 | 2/2010 |
| EP | 2369852 A1 | 9/2011 |
| EP | 2642769 A1 | 9/2013 |
| EP | 3079375 A1 | 10/2016 |
| JP | 3433342 B2 | 8/2003 |
| JP | 2004312141 A | 11/2004 |
| JP | 2005129977 A | 5/2005 |
| JP | 2007060648 A | 3/2007 |
| JP | 2007081815 A | 3/2007 |
| JP | 2015082754 A | 4/2015 |
| JP | 2015084499 A | 4/2015 |
| JP | 6182869 B2 | 8/2017 |
| KR | 10-2005002384 A | 3/2005 |
| KR | 10-20130001162 | 1/2013 |
| KR | 10-20140097874 A | 8/2014 |
| KR | 101445186 B1 | 10/2014 |
| WO | 2013182901 A | 12/2013 |
| WO | 2014045123 A | 3/2014 |
| WO | 2015143127 A | 9/2015 |
| WO | 2015191691 A1 | 12/2015 |
| WO | 2017088876 A2 | 6/2017 |

OTHER PUBLICATIONS

International Search Report and Written Opinion dated May 7, 2019 for International Application PCT/KR2019/001090 from Korean Intellectual Property Office, pp. 1-13, Republic of Korea.

ProSoundWeb, "Harman Unveils JBL 3 Series Mk II Powered Studio Monitors," Jan. 2018, pp. 1-4, EH Publishing, United States, downloaded at: https://www.prosoundweb.com/channels/recording/harman-unveils-jbl-3-series-mkii-powered-studio-monitors/.

U.S. Supplemental Notice of Allowability for U.S. Appl. No. 15/835,245 dated Jul. 15, 2019.

U.S. Notice of Allowance for U.S. Appl. No. 15/873,530 dated Jul. 18, 2019.

International Search Report and Written Opinion dated Dec. 23, 2019 for International Application PCT/KR2019/011200 from Korean Intellectual Property Office, pp. 1-12, Republic of Korea.

International Search Report dated Jun. 21, 2019 for International Application PCT/KR2019/002741 from Korean Intellectual Property Office, pp. 1-3, Republic of Korea.

(56) References Cited

OTHER PUBLICATIONS

U.S. Supplemental Notice of Allowability for U.S. Appl. No. 15/835,245 dated Aug. 28, 2019.
U.S. Notice of Allowability for U.S. Appl. No. 15/873,530 dated Aug. 28, 2019.
U.S. Notice of Allowability for U.S. Appl. No. 15/873,530 dated Sep. 9, 2019.
U.S. Notice of Allowance for U.S. Appl. No. 16/057,711 dated Sep. 17, 2019.
International Search Report and Written Opinion dated Apr. 29, 2019 for International Application PCT/KR2019/000702 from Korean Intellectual Property Office, pp. 1-10, Republic of Korea.
U.S. Notice of Allowance for U.S. Appl. No. 15/835,245 dated May 6, 2019.
Thomsen, S. et. al., "Design and Analysis of a Flatness-Based Control Approach for Speed Control of Drive Systems with Elastic Couplings and Uncertain Loads," Proceedings of the 2011—14th European Conference (EPE 2011), Aug. 30-Sep. 1, 2011, pp. 1-10, IEEE Press, United States.
Fliess, M. et al., "Flatness and Defect of Nonlinear Systems: Introductory Theory and Examples", International Journal of Control, Jun. 1995, pp. 1327-1361, vol. 61, Taylor & Francis, United Kingdom.
Papazoglou, N. et al., "Linearisation par Asservissement d'unhaut-parleur electrodynamique: approche par les Systemes Hamiltoniens a Ports", Memoire De Fin D Etude M2R SAR Parcourt ATIAM, pp. 1-52, Aug. 11, 2014.
International Search Report and Written Opinion dated Mar. 31, 2017 for International Application PCT/KR2016/015435 from Korean Intellectual Property Office, pp. 1-12, Republic of Korea.
International Search Report and Written Opinion dated Apr. 20, 2018 for International Application PCT/KR2018/000016 from Korean Intellectual Property Office, pp. 1-5, Republic of Korea.
Salvatti, A. et al., "Maximizing performance from loudspeaker ports", Journal of the Audio Engineering Society, Jan./Feb. 2002, pp. 19-45, v. 50, No. 1/2, United States.
Extended European Search Report dated Jul. 23, 2018 for European Application No. 16882101.5 from European Patent Office, pp. 1-8, Munich, Germany.
Hu, Y. et al., "Effects of the Cone and Edge on the Acoustic Characteristics of a Cone Loudspeaker", Advances in Acoustics and Vibration, May 21, 2017, pp. 1-12, vol. 2017, Hindawi, Japan.
U.S. Non-Final Office Action for U.S. Appl. No. 15/391,633 dated Mar. 28, 2019.
U.S. Non-Final Office Action for U.S. Appl. No. 15/835,245 dated Jun. 14, 2018.
U.S. Final Office Action for U.S. Appl. No. 15/835,245 dated Jan. 10, 2019.
U.S. Advisory Action for U.S. Appl. No. 15/835,245 dated Apr. 11, 2019.
U.S. Notice of Allowance for U.S. Appl. No. 16/057,711 dated Apr. 2, 2019.
U.S. Corrected Notice of Allowability for U.S. Appl. No. 15/391,633 dated Dec. 12, 2019.
U.S. Notice of Allowance for U.S. Appl. No. 15/391,633 dated Sep. 18, 2019.
U.S. Supplemental Notice of Allowability for U.S. Appl. No. 15/835,245 dated Oct. 1, 2019.
U.S. Corrected Notice of Allowability for U.S. Appl. No. 15/873,530 dated Oct. 18, 2019.
U.S. Corrected Notice of Allowability for U.S. Appl. No. 15/873,530 dated Nov. 12, 2019.
U.S. Non-Final Office Action for U.S. Appl. No. 16/224,604 dated Oct. 22, 2019.
European Office Action dated Nov. 15, 2019 for European Application No. 16882101.5 from European Patent Office, pp. 1-6, Munich, Germany.
Chinese Office Action dated Dec. 5, 2019 for Chinese Patent Application No. 201680076647.X from Chinese Patent Office, pp. 1-21, Beijing, China (English-language translation included pp. 1-14).
Extended European Search Report dated Nov. 21, 2019 for European Application No. 18736189.4 from European Patent Office, pp. 1-7, Munich, Germany.
Schurer, H. et al., "Theoretical and experimental comparison of three methods for compensation of electrodynamic transducer nonlinearity.", Journal of the Audio Engineering Society, Sep. 1, 1998, vol. 46, No. 9, pp. 723-740, The Netherlands.
U.S. Notice of Allowance for U.S. Appl. No. 16/224,604 dated Feb. 13, 2020.
Henwood, D.J. et al., "The Boundary-Element Method and Horn Design", Journal of the Audio Engineering Society, Jun. 1, 1993, vol. 41, No. 6, pp. 485-496.
U.S. Non-Final Office Action for U.S. Appl. No. 16/457,619 dated May 15, 2020.

\* cited by examiner

440

450

PORT VELOCITY LIMITER FOR VENTED BOX LOUDSPEAKERS

CROSS-REFERENCE TO RELATED APPLICATIONS

This application claims the priority benefit of U.S. Provisional Patent Application Ser. No. 62/727,877, filed Sep. 6, 2018, all incorporated herein by reference in their entirety

TECHNICAL FIELD

One or more embodiments relate generally to loudspeakers, and in particular, a limiter for limiting velocity of air in a port of a vented box loudspeaker.

BACKGROUND

A loudspeaker produces sound when connected to an integrated amplifier, a television (TV) set, a radio, a music player, an electronic sound producing device (e.g., a smartphone, a computer), a video player, etc.

SUMMARY

One embodiment provides a method comprising determining an energy stored in a port of a vented box loudspeaker based on a physical model of the vented box loudspeaker, determining a time-varying attenuation to apply to a source signal for reproduction via the vented box loudspeaker based on the energy stored in the port, and controlling the energy stored in the port in real-time by attenuating the source signal based on the time-varying attenuation. A velocity of air in the port during the reproduction of the source signal is limited based on the controlling.

Another embodiment provides a system comprising a voltage source amplifier connected to a vented box loudspeaker, and a limiter connected to the voltage source amplifier. The limiter is configured to determine an energy stored in a port of a vented box loudspeaker based on a physical model of the vented box loudspeaker, determine a time-varying attenuation to apply to a source signal for reproduction via the vented box loudspeaker based on the energy stored in the port, and controlling the energy stored in the port in real-time by attenuating the source signal based on the time-varying attenuation, wherein a velocity of air in the port during the reproduction of the source signal is limited based on the controlling.

One embodiment provides a loudspeaker device comprising an enclosure comprising a port and an active speaker driver including a diaphragm, a voltage source amplifier connected to the speaker driver, and a limiter connected to the voltage source amplifier. The limiter is configured to determine an energy stored in the port based on a physical model of the loudspeaker device, determine a time-varying attenuation to apply to a source signal for reproduction via the loudspeaker device based on the energy stored in the port, and controlling the energy stored in the port in real-time by attenuating the source signal based on the time-varying attenuation. A velocity of air in the port during the reproduction of the source signal is limited based on the controlling.

These and other features, aspects and advantages of the one or more embodiments will become understood with reference to the following description, appended claims, and accompanying figures.

DETAILED DESCRIPTION

Figure 1:
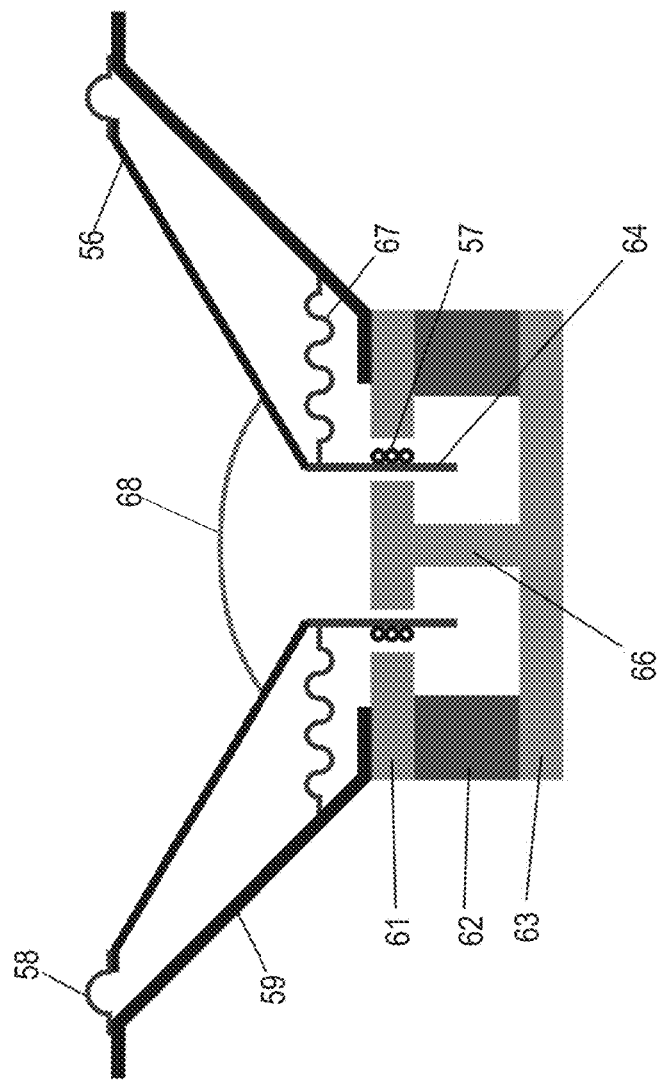
FIG. 1 illustrates a cross section of an example speaker driver.

The following description is made for the purpose of illustrating the general principles of one or more embodiments and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

One or more embodiments relate generally to loudspeakers, and in particular, a limiter for limiting velocity of air in a port of a vented box loudspeaker. One embodiment provides a method comprising determining an energy stored in a port of a vented box loudspeaker based on a physical model of the vented box loudspeaker, determining a time-varying attenuation to apply to a source signal for reproduction via the vented box loudspeaker based on the energy stored in the port, and controlling the energy stored in the port in real-time by attenuating the source signal based on the time-varying attenuation. A velocity of air in the port during the reproduction of the source signal is limited based on the controlling.

Another embodiment provides a system comprising a voltage source amplifier connected to a vented box loudspeaker, and a limiter connected to the voltage source amplifier. The limiter is configured to determine an energy stored in a port of a vented box loudspeaker based on a physical model of the vented box loudspeaker, determine a time-varying attenuation to apply to a source signal for reproduction via the vented box loudspeaker based on the energy stored in the port, and controlling the energy stored in the port in real-time by attenuating the source signal based on the time-varying attenuation, wherein a velocity of air in the port during the reproduction of the source signal is limited based on the controlling.

One embodiment provides a loudspeaker device comprising an enclosure comprising a port and an active speaker driver including a diaphragm, a voltage source amplifier connected to the speaker driver, and a limiter connected to the voltage source amplifier. The limiter is configured to determine an energy stored in the port based on a physical model of the loudspeaker device, determine a time-varying attenuation to apply to a source signal for reproduction via the loudspeaker device based on the energy stored in the port, and controlling the energy stored in the port in real-time by attenuating the source signal based on the time-varying attenuation. A velocity of air in the port during the reproduction of the source signal is limited based on the controlling.

For expository purposes, the terms "loudspeaker", "loudspeaker device", and "loudspeaker system" may be used interchangeably in this specification.

For expository purposes, the terms "vented box loudspeaker", "vented box loudspeaker device", and "vented box loudspeaker system" may be used interchangeably in this specification.

For expository purposes, the terms "displacement" and "excursion" may be used interchangeably in this specification.

A conventional loudspeaker is nonlinear by design and produces harmonics, intermodulation components, and modulation noise. Nonlinear audio distortion impairs sound quality of audio produced by the loudspeaker (e.g., audio quality and speech intelligibility). In recent times, industrial design constraints often require loudspeaker systems to be smaller-sized for portability and compactness. Such design constraints, however, trade size and portability for sound quality, resulting in increased audio distortion. As such, an anti-distortion system for reducing/removing audio distortion is needed, in particular for obtaining a more pronounced/bigger bass sound from smaller-sized loudspeaker systems.

A vented box loudspeaker system (i.e., a ported loudspeaker) comprises a loudspeaker enclosure including a port (i.e., a vent or ported enclosure) to improve bass output and sound loudness from the loudspeaker system. At low frequencies, the port acts as a supplemental sound source and re-enforces the bass output from the loudspeaker system. At high sound reproduction levels, the port can emit extraneous noises due to a high velocity of air flowing through the port. The flow of air (i.e., airflow) through the port can become turbulent when the velocity of the air exceeds a particular limit (e.g., 30 m/s), where the resulting turbulence creates an apparition of air/wind noise from the port. It is therefore important to monitor and control the velocity of air flow through the port. Conventional limiters limit driver excursion in loudspeaker systems, but none directly limit velocity of air in a port of a vented box loudspeaker system.

One or more embodiments provide a method and system for monitoring and controlling velocity of air in a port (e.g., a ported enclosure) of a vented box loudspeaker system (e.g., a ported loudspeaker). One or more embodiments provide a limiter configured to directly estimate, monitor, control, and limit velocity of air in a port of a vented box loudspeaker system to reduce or prevent an apparition of air/wind noise from the port. In one embodiment, the velocity of the air in the port is limited by monitoring and controlling an amount of energy stored in the port. Specifically, the amount of energy is estimated at each instant based on an input voltage at the instant and a physical model of the loudspeaker system, and the amount of energy is controlled in real-time by determining and applying a time varying attenuation to the input voltage.

A loudspeaker device includes at least one speaker driver for reproducing sound. FIG. 1 illustrates a cross section of an example speaker driver 55. The speaker driver 55 comprises one or more moving components, such as a diaphragm 56 (e.g., a cone-shaped diaphragm), a driver voice coil 57, a former 64, and a protective cap 68 (e.g., a dome-shaped dust cap). The speaker driver 55 further comprises one or more of the following components: (1) a surround roll 58 (e.g., suspension roll), (2) a basket 59, (3) a top plate 61, (4) a magnet 62, (5) a bottom plate 63, (6) a pole piece 66, and (7) a spider 67.

Figure 2A:
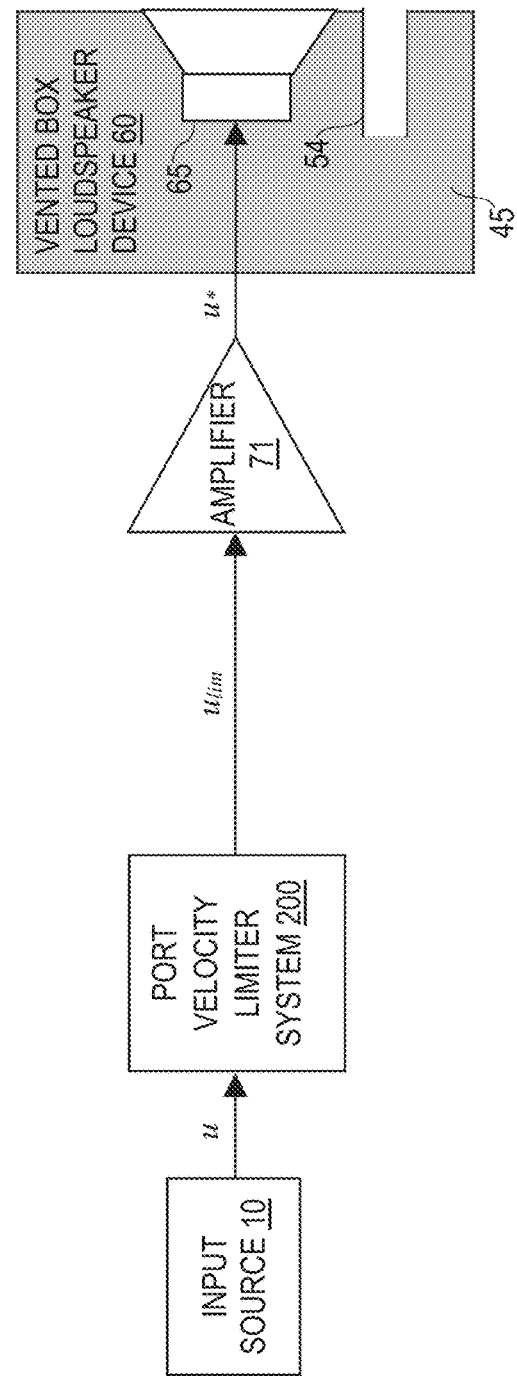
FIG. 2A illustrates an example loudspeaker system including a vented box loudspeaker device, in accordance with an embodiment.

FIG. 2A illustrates an example loudspeaker system 100, in accordance with an embodiment. The loudspeaker system 100 comprises a vented box loudspeaker device 60. The vented box loudspeaker device 60 comprises a loudspeaker enclosure 45 including at least one active speaker driver 65 for reproducing sound and at least one port 54. The active speaker driver 65 may be any type of speaker driver such as, but not limited to, a forward-facing speaker driver, an upward-facing speaker driver, a downward-facing speaker driver, etc. In one embodiment, the speaker driver 55 in FIG. 1 is an example implementation of the active speaker driver 65. The active speaker driver 65 comprises one or more moving components, such as a diaphragm 56 (FIG. 1) and a driver voice coil 57 (FIG. 1).

The vented box loudspeaker device 60 has increased efficiency at low sound frequencies, allowing the vented box loudspeaker device 60 to attain significantly more bass output. Specifically, at low sound frequencies, the port 54 becomes a predominant sound source that complements the one or more moving components of the active speaker driver 65, resulting in a bass level boost (i.e., enhanced bass output) that is limited through to a narrow sound frequency range.

The loudspeaker system 100 comprises a port velocity limiter system 200. The port velocity limiter system 200 is a limiter configured to estimate, monitor, and control energy in the port 54 to estimate/predict and limit velocity of air in the port 54 during audio reproduction.

In one embodiment, the port velocity limiter system 200 is configured to receive a source signal (e.g., an input signal such as an input audio signal) from an input source 10 for audio reproduction via the vented box loudspeaker device 60. In one embodiment, the port velocity limiter system 200 is configured to receive a source signal from different types of input sources 10. Examples of different types of input sources 10 include, but are not limited to, a mobile electronic device (e.g., a smartphone, a laptop, a tablet, etc.), a content playback device (e.g., a television, a radio, a computer, a music player such as a CD player, a video player such as a DVD player, a turntable, etc.), or an audio receiver, etc. Let u generally denote an input voltage of the source signal.

In one embodiment, in addition to limiting velocity of air in the port 54 during audio reproduction, the port velocity limiter system 200 is further configured to compress the velocity of air in the port 54 during the audio reproduction. Compressing the velocity of air in the port 54 is a refinement that the limiter provides to reduce or eliminate harsh transitions resulting from limiting the velocity of air in the port 54 (e.g., a harsh transition from an unlimited/not limited velocity of air in the port 54 to a limited velocity of air in the port 54), thereby providing a more gradual step response to input voltage.

As described in detail later herein, the port velocity limiter system 200 is configured to: (1) based on a physical model of the vented box loudspeaker device 60, determine energy in the port 54, and (2) determine, in real-time, an amount of attenuation to apply to the input voltage u to produce an energy and velocity limited voltage ("limited voltage") $u_{lim}$ that limits (and additionally compresses, in some embodiments) the energy in the port 54 and in turn limits (and additionally compresses, in some embodiments) velocity of air in the port 54 to within a predetermined range.

A physical model of the vented box loudspeaker device 60 may be based on one or more loudspeaker parameters for the vented box loudspeaker device 60. In one embodiment, a physical model of the vented box loudspeaker device 60 utilized by the port velocity limiter system 200 is a linear model. In another embodiment, a physical model of the vented box loudspeaker device 60 utilized by the port velocity limiter system 200 is a nonlinear model.

In one embodiment, the loudspeaker system 100 comprises a voltage source amplifier 71 connected to the vented box loudspeaker device 60 and the port velocity limiter system 200. The voltage source amplifier 71 is a power amplifier configured to output (i.e., apply or produce), for each sampling time t, an actual voltage (i.e., applied voltage) u* based on a limited voltage $u_{lim}$ determined by the port velocity limiter system 200 at the sampling time t. The limited voltage $u_{lim}$ controls the voltage source amplifier 71, directing the voltage source amplifier 71 to output an amount of voltage that is substantially the same as the limited voltage $u_{lim}$. The active speaker driver 65 is driven by the actual voltage u* output by the voltage source amplifier 71, thereby amplifying the source signal for audio reproduction via the vented box loudspeaker device 60. Therefore, the loudspeaker system 100 controls velocity of air in the port 54 during the audio reproduction of the source signal by performing voltage correction based on the limited voltage $u_{lim}$.

The port velocity limiter system 200 facilitates a higher level of audio reproduction, with improved sound quality, and additional control of the vented box loudspeaker device 60. The port velocity limiter system 200 provides precise control of a maximum velocity of air in the port 54 based on a physical modeling of the vented box loudspeaker device 60 to ensure accuracy. The port velocity limiter system 200 maximizes bass output and sound loudness. The port velocity limiter system 200 facilitates smooth control of energy in the port 54 to preserve audio quality. The port velocity limiter system 200 utilizes a time-domain algorithm without any change in frequency content or spectral balance (i.e., frequency filtering).

In one embodiment, the port velocity limiter system 200 is combined with an excursion limiter and/or a voltage limiter (e.g., implemented by the controller 110 (FIG. 2B)) to protect the vented box loudspeaker device 10.

In one embodiment, the loudspeaker system 100 may be integrated in different types of electrodynamic transducers with a broad range of applications such as, but not limited to, the following: computers, televisions (TVs), smart devices (e.g., smart TVs, smart phones, etc.), soundbars, subwoofers, wireless and portable speakers, mobile phones, car speakers, etc.

Figure 2B:
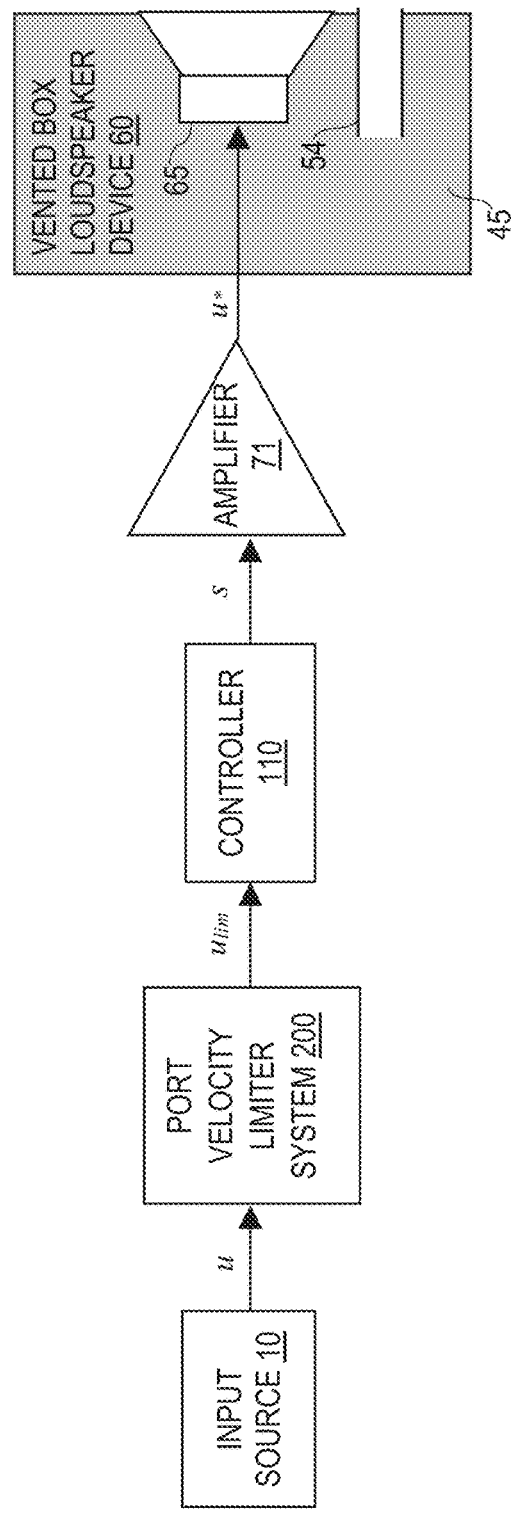
FIG. 2B illustrates another example loudspeaker system including a vented box loudspeaker device, in accordance with an embodiment.

FIG. 2B illustrates another example loudspeaker system 105, in accordance with an embodiment. The loudspeaker system 105 comprises the same components as the loudspeaker system 100 in FIG. 2A and a controller 110 for linear or nonlinear control of the vented box loudspeaker device 60. For example, in one embodiment, the controller 110 is a nonlinear control system configured to provide correction of nonlinear audio distortion by pre-distorting voltage to the active speaker driver 65. The controller 110 is configured to receive, as input, a limited voltage $u_{lim}$ at a sampling time t (e.g., from the port velocity limiter system 200), and generate and transmit a control signal s specifying a target voltage (e.g., a target voltage that produces a desired/target displacement/excursion of one or more moving components of the active speaker driver 65 at the sampling time t). The control signal s can be any type of signal such as, but not limited to, a current, a voltage, a digital signal, an analog signal, etc. In one embodiment, the voltage source amplifier 71 is configured to output an actual voltage u* at a sampling time t based on a control signal s from the controller 110, wherein the control signal s directs the voltage source amplifier 71 to output an amount of voltage that is substantially the same as a target voltage included in the control signal s for the sampling time t.

Figure 3:
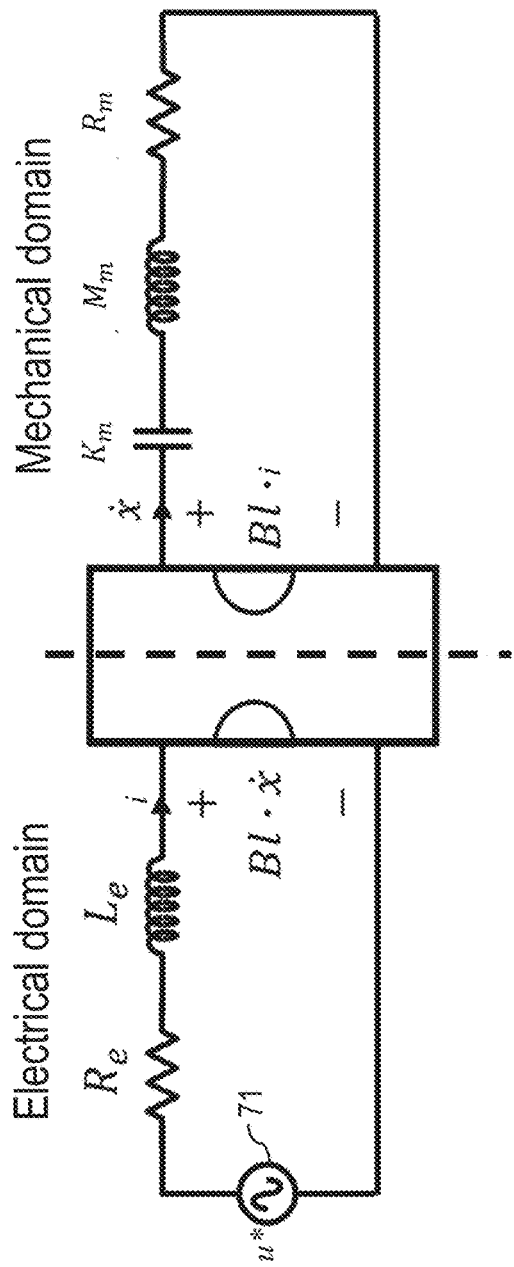
FIG. 3 illustrates an example electroacoustic model for a vented box loudspeaker device driven by a voltage source amplifier.

FIG. 3 illustrates an example electroacoustic model 70 for a vented box loudspeaker device 60 (FIGS. 2A, 2B) driven by a voltage source amplifier 71. One or more loudspeaker parameters (i.e., loudspeaker characteristics) for the vented box loudspeaker device 60 may be classified into one of the following domains: an electrical domain or a mechanical domain. In the electrical domain, examples of different loudspeaker parameters include, but are not limited to, the following: (1) an applied voltage u* from the voltage source amplifier 71 for driving a speaker driver 65 of the vented box loudspeaker device 60, (2) an electrical resistance $R_e$ of a driver voice coil 57 of the speaker driver 65, (3) a current i flowing through the driver voice coil 57 as a result of the applied voltage u*, (4) an inductance $L_e$ of the driver voice coil 57, and (5) a back electromagnetic force (back EMF) Bl·ẋ resulting from the motion of the driver voice coil 57 in the magnetic field of the motor structure (i.e., driver voice coil 57, top plate 61, magnet 62, bottom plate 63, and pole piece 66) of the speaker driver 65, wherein the back-EMF Bl·ẋ represents a product of a force factor Bl of the motor structure and a velocity ẋ of one or more moving components of the speaker driver 65 (e.g., a diaphragm 56, the driver voice coil 57, and/or the former 64).

In the mechanical domain, examples of different loudspeaker parameters include, but are not limited to, the following: (1) the velocity ẋ of the one or more moving components of the speaker driver 65, (2) a mechanical mass $M_m$ of the one or more moving components (i.e., moving mass) and air load, (3) a mechanical resistance $R_m$ representing the mechanical losses of the speaker driver 65, (4) a stiffness factor $K_m$ of the suspension (i.e., surround roll 58, spider 67, plus air load) of the speaker driver 65, and (5) a mechanical force $Bl \cdot i$ applied on the one or more moving components, wherein the mechanical force $Bl \cdot i$ represents a product of the force factor $Bl$ of the motor structure and the current $i$ flowing through the driver voice coil 57.

In one embodiment, the port velocity limiter system 200 utilizes a linear state-space model of the vented box loudspeaker device 60 to determine a state of the vented box loudspeaker device 60. For example, in one embodiment, linear dynamics of the vented box loudspeaker device 60 may be represented in accordance with equations (1)-(4) provided below.

The state of a vented box loudspeaker device 60 at each instant may be described using each of the following: (1) a displacement $x$ of the one or more moving components of the speaker driver 65, (2) a velocity $\dot{x}$ of the one or more moving components of the speaker driver 65, (3) a current $i$ flowing through the driver voice coil 57, (4) a velocity $q$ of air in the port 54 (i.e., port velocity), and (5) a sound pressure $p$ in the vented box loudspeaker device 60. Let $X(t)$ generally denote a vector representing a state ("state vector representation") of the vented box loudspeaker device 60 at a sampling time $t$. The state vector representation $X(t)$ may be defined in accordance with equation (1) provided below:

$$X(t) = [x \ \dot{x} \ i \ q \ p]^T \quad (1).$$

For expository purposes, the terms $X(t)$ and $X$ are used interchangeably in this specification.

Let A and B generally denote constant parameter matrices. In one embodiment, the constant parameter matrices A and B are represented in accordance with equations (2)-(3) provided below:

$$A = \begin{bmatrix} 0 & 1 & 0 & 0 & 0 \\ -\frac{K_m}{M_m} & -\frac{R_m}{M_m} & \frac{Bl}{M_m} & 0 & -\frac{S_d}{M_m} \\ 0 & -\frac{Bl}{L_e} & -\frac{R_e}{L_e} & 0 & 0 \\ 0 & 0 & 0 & -\frac{R_a}{M_a} & \frac{1}{M_a} \\ 0 & K_b S_d & 0 & -K_b & 0 \end{bmatrix}, \text{ and} \quad (2)$$

$$B = \begin{bmatrix} 0 \\ 0 \\ \frac{1}{L_e} \\ 0 \\ 0 \end{bmatrix}, \quad (3)$$

wherein $S_d$ is a surface area of the diaphragm 56 of the speaker driver 65, $R_a$ is an acoustic resistance representing the acoustic losses of the port 54, $M_a$ is an acoustic mass of air in the port 54, and $K_b$ is an acoustic stiffness representing stiffness of air in an enclosure 45 of the vented box loudspeaker device 60.

In one embodiment, an acoustic resistance $R_a$ and an acoustic mass $M_a$ associated with the port 54 may be functions of one or more variables of the state vector representation X, such as a port velocity $q$.

Let $\dot{X}$ generally denote a time derivative (i.e., rate of change) of the state vector representation X of the vented box loudspeaker device 60 ("state vector rate of change"), wherein the state vector rate of change $\dot{X}$ is defined in accordance with a differential equation (4) provided below:

$$\dot{X} = AX + Bu \quad (4).$$

In another embodiment, the port velocity limiter system 200 utilizes a nonlinear state-space model of the vented box loudspeaker device 60 to determine a state of the vented box loudspeaker device 60. For example, in one embodiment, nonlinear dynamics for the vented box loudspeaker device 60 may be represented in accordance with equations (5)-(12) provided below:

$$M_m \ddot{x} + K_m(x)x + R_m \dot{x} + S_d p = Bl(x)i \quad (5),$$

wherein equation (5) represents a mechanical equation for the speaker driver 65, $$Bl(x)\dot{x} + R_e i + \partial\{L_e(x)i\}/\partial t = u \quad (6),$$

wherein equation (6) represents an electrical equation for the speaker driver 65, $$p = M_a \dot{q} + R_a q \quad (7), \text{ and}$$

$$\dot{p} = (S_d \dot{x} - q) K_b \quad (8),$$

wherein equations (7)-(8) represent port equations for the port 54. The port equations (7)-(8) define a linear state-space system of 2nd order with input $\dot{x}$, as represented by equation (9) provided below:

$$\begin{bmatrix} \dot{q} \\ \dot{p} \end{bmatrix} = \begin{bmatrix} -\frac{R_a}{M_a} & \frac{1}{M_a} \\ -K_b & 0 \end{bmatrix} \begin{bmatrix} q \\ p \end{bmatrix} + \begin{bmatrix} 0 \\ S_d \end{bmatrix} \dot{x}. \quad (9)$$

Let $E_{port}$ generally denote an amount of total energy stored in the port 54 (i.e., port energy), wherein the port energy $E_{port}$ is based on potential energy stored in the port 54 and kinetic energy stored in the port 54. Port energy $E_{port}$ may be represented in accordance with equation (10) provided below:

$$E_{port} = 0.5\left(M_a q^2 + K_b\left(S_d x - \frac{p}{K_b}\right)^2\right). \quad (10)$$

Let $|q_{sup}|$ generally denote a maximum port velocity envelope for port velocity $q$, wherein $q_{sup}$ represents a positive value of a maximum port velocity (i.e., maximum velocity of air in the port 54), and $-q_{sup}$ represents a negative value of the maximum port velocity. A maximum port velocity $\pm q_{sup}$ occurs when port energy $E_{port}$ is equal to kinetic energy in the port 54, as shown in equations (11)-(12) provided below:

$$E_{port} = 0.5 M_a q_{sup}^2, \text{ and} \quad (11)$$

$$|q_{sup}| = \sqrt{\frac{2E_{port}}{M_a}}. \quad (12)$$

Let $q_{lim}$ generally denote a predetermined limit for port velocity $q$ (i.e., port velocity limit). To maintain a port velocity $q$ within a port velocity limit $q_{lim}$, port energy $E_{port}$ may be limited in accordance with equation (13) provided below:

$$E_{port} \leq \frac{M_a q_{lim}^2}{2}. \quad (13)$$

Figure 4:
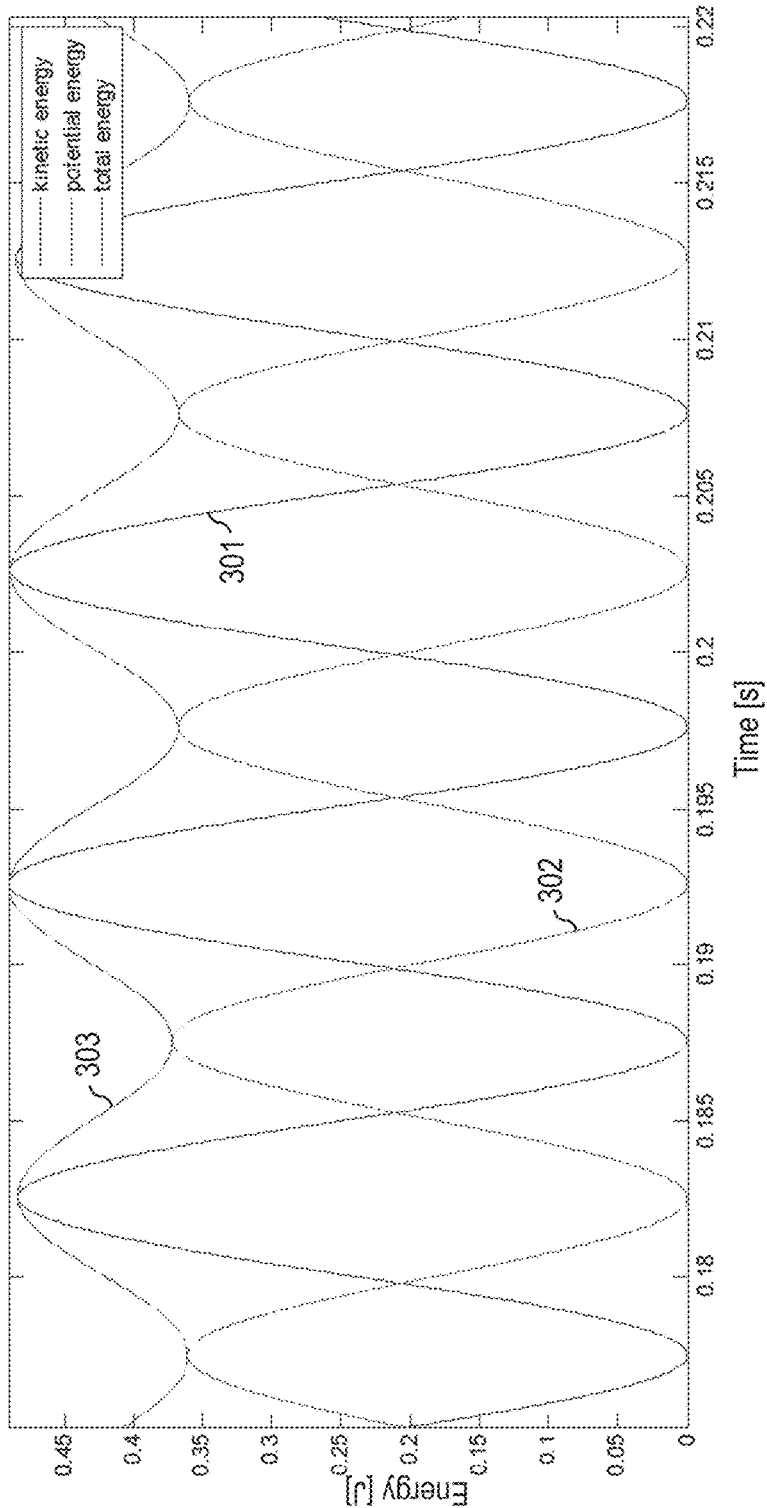
FIG. 4 is an example graph illustrating energy in a port of a vented box loudspeaker device during audio reproduction.

FIG. 4 is an example graph 300 illustrating energy in a port 54 of a vented box loudspeaker device 60 during audio reproduction. A horizontal axis of the graph 300 represents time in seconds (s). A vertical axis of the graph 300 represents energy in Joules (J). The graph 300 comprises each of the following: (1) a first curve 301 representing kinetic energy in the port 54 in J, (2) a second curve 302 representing potential energy in the port 54 in J, and (3) a third curve 303 representing total energy in the port 54 (i.e., port energy $E_{port}$) in J.

Figure 5:
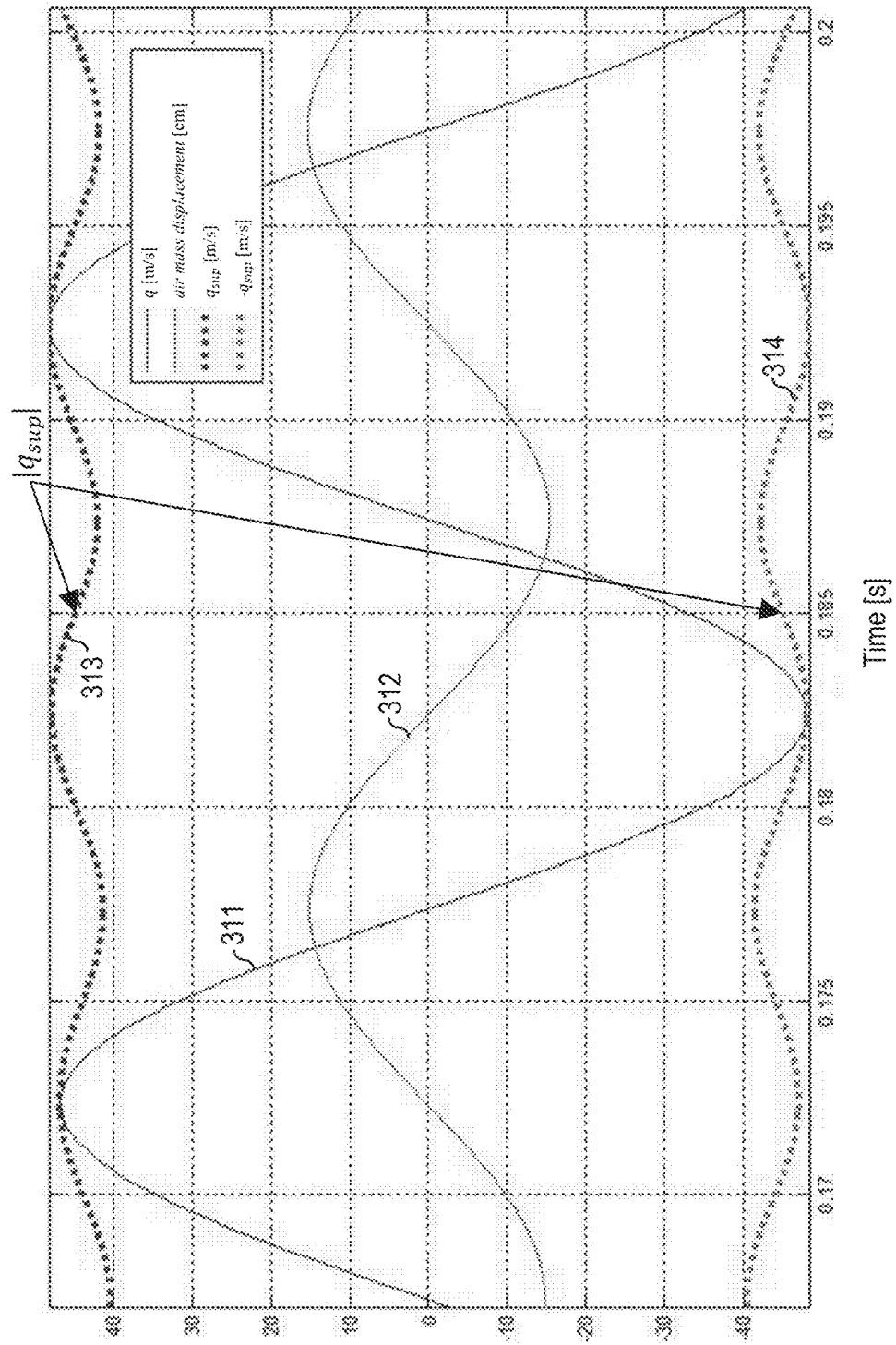
FIG. 5 is an example graph illustrating velocity of air in a port of a vented box loudspeaker device during audio reproduction.

FIG. 5 is an example graph 310 illustrating velocity of air in a port 54 of a vented box loudspeaker device 60 during audio reproduction. A horizontal axis of the graph 300 represents time in s. The graph 310 comprises each of the following: (1) a first curve 311 representing a velocity q of air in the port 54 (i.e., port velocity) in meters per second (m/s), (2) a second curve 312 representing air mass displacement in the port 54 in centimeters (cm), (3) a third curve 313 representing a negative value $-q_{sup}$ of a maximum port velocity in m/s, and (4) a fourth curve 314 representing a positive value $q_{sup}$ of the maximum port velocity in m/s.

Figure 6:
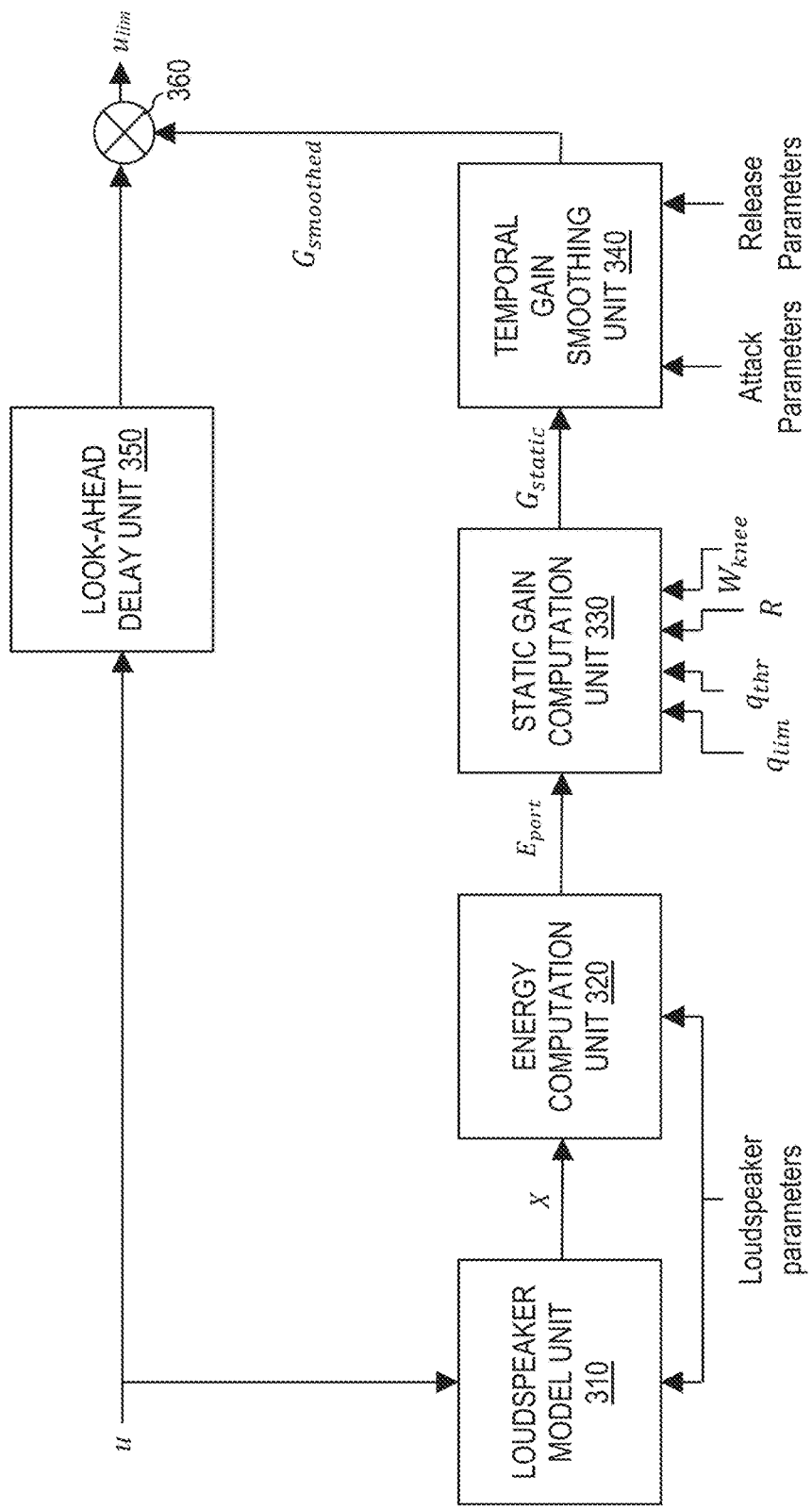
FIG. 6 illustrates an example port velocity limiter system for a vented box loudspeaker device, in accordance to an embodiment.

FIG. 6 illustrates an example port velocity limiter system 200, in accordance to an embodiment. As described in detail later herein, the port velocity limiter system 200 provides a limiter for limiting (and compressing, in some embodiments) energy in a port 54 of a vented box loudspeaker device 60, which in turn limits (and compresses, in some embodiments) velocity q of air in the port 54.

In one embodiment, the port velocity limiter system 200 comprises a loudspeaker model unit 310 configured to receive, as inputs, an input voltage u at a sampling time t and one or more loudspeaker parameters for the vented box loudspeaker device 60 (e.g., small-signal physical parameters for the vented box loudspeaker device 60, such as mechanical mass $M_{ms}$, inductance $L_e$, and stiffness factor $K_{ms}$). Based on the inputs received and a physical model of the vented box loudspeaker device 60 (e.g., a linear state-space model or a nonlinear state-space model), the loudspeaker model unit 310 is configured to recursively determine a state X of the vented box loudspeaker device 60 at the sampling time t. Specifically, the loudspeaker model unit 310 is configured to recursively determine each of the following: (1) an estimated displacement x of one or more moving components of a speaker driver 65 (e.g., a diaphragm 56, the driver voice coil 57, and/or the former 64) of the vented box loudspeaker device 60 at the sampling time t, (2) an estimated velocity ẋ of the one or more moving components of the speaker driver 65 at the sampling time t, (3) an estimated current i flowing through a driver voice coil 57 of the speaker driver 65 at the sampling time t, (4) an estimated velocity q of air in the port 54 (i.e., port velocity) at the sampling time t, and (5) an estimated sound pressure p in the vented box loudspeaker device 60 at the sampling time t.

In one embodiment, the port velocity limiter system 200 comprises an energy computation unit 320 configured to receive, as inputs, an estimated displacement x of the one or more moving components of the speaker driver 65 at a sampling time t (e.g., from the loudspeaker model unit 310), an estimated velocity ẋ of the one or more moving components of the speaker driver 65 at the sampling time t (e.g., from the loudspeaker model unit 310), an estimated current i flowing through the driver voice coil 57 at the sampling time t (e.g., from the loudspeaker model unit 310), an estimated port velocity q at the sampling time t (e.g., from the loudspeaker model unit 310), an estimated sound pressure p in the vented box loudspeaker device 60 at the sampling time t (e.g., from the loudspeaker model unit 310), and one or more loudspeaker parameters for the vented box loudspeaker device 60 (e.g., small-signal physical parameters for the vented box loudspeaker device 60, such as surface area $S_d$ of the diaphragm 56 of the speaker driver 65, an acoustic mass $M_a$ of air in the port 54, and acoustic stiffness $K_b$). Based on the inputs received, the energy computation unit 320 is configured to determine an amount of energy $E_{port}$ in the port 54 (i.e., port energy) at the sampling time t.

In one embodiment, the energy computation unit 320 is configured to determine an estimated port energy $E_{port}$ at a sampling time t by: (1) computing, based on the inputs received, potential energy in the port 54 at the sampling time t and kinetic energy in the port 54 at the sampling time t, and (2) compute a sum of the potential energy and the kinetic energy, wherein the port energy $E_{port}$ factors into account the sum computed.

In one embodiment, the energy computation unit 320 is configured to determine port energy $E_{port}$ at a sampling time t in accordance with equation (14) provided below:

$$E_{port} = 10\log_{10}(\text{potential energy} + \text{kinetic energy}) \quad (14)$$
$$= 10\log_{10}\left(\frac{M_a q^2 + K_b\left(S_d x - \frac{p}{K_b}\right)^2}{2}\right).$$

In another embodiment, the energy computation unit 320 is configured to determine port energy $E_{port}$ at a sampling time t based on a predictive model trained to learn dynamics of energy.

In one embodiment, the port velocity limiter system 200 comprises a static gain computation unit 330 configured to receive, as inputs, an estimated port energy $E_{port}$ at a sampling time t (e.g., from the energy computation unit 320) and a set of port velocity parameters indicative of a desired behavior of velocity of air in the port 54 (i.e., port velocity behavior). In one embodiment, the set of port velocity parameters comprise, but is not limited to, one or more of the following port velocity parameters: a predetermined limit $q_{lim}$ for port velocity q (i.e., port velocity limit), a predetermined compression threshold $q_{thr}$ for the port velocity q (i.e., port velocity compression threshold), a predetermined compression ratio R, or a predetermined soft knee width $W_{knee}$. Based on the inputs received, the static gain computation unit 330 is configured to determine an instantaneous gain $G_{static}$ to apply at the sampling time t to limit and/or compress a port velocity q at the sampling time t.

Let $E_{lim}$ generally denote a predetermined limit for port energy $E_{port}$ (i.e., energy limit). In one embodiment, the port velocity limiter system 200 operates as a limiter (i.e., the limiter is enabled) to limit a port energy $E_{port}$ at a sampling time t based on an energy limit $E_{lim}$.

Let $E_{thr}$ generally denote a predetermined compression threshold for port energy $E_{port}$ (i.e., energy compression threshold). In one embodiment, the port velocity limiter system 200 operates as a limiter to limit and compress a port energy $E_{port}$ at a sampling time t based on an energy limit $E_{lim}$ and an energy compression threshold $E_{thr}$. In one embodiment, the port velocity limiter system 200 is operable as one of the following: a limiter that limits port velocity, or a limiter that limits and compresses port velocity.

In one embodiment, the static gain computation unit 330 is configured to convert one or more port velocity parameters to one or more corresponding energy parameters. For example, in one embodiment, if the limiter is enabled to limit a port velocity q, the static gain computation unit 330 is configured to convert a port velocity limit $q_{lim}$ received as an input to an energy limit $E_{lim}$ in accordance with equation (15) provided below:

$$E_{lim} = 10\log_{10}\left[\frac{1}{2}M_a q_{lim}^2\right]. \quad (15)$$

As another example, in one embodiment, if the limiter is enabled to limit and compress a port velocity q, the static gain computation unit 330 is configured to convert a port velocity compression threshold $q_{thr}$ received as an input to an energy compression threshold $E_{thr}$ in accordance with equation (16) provided below:

$$E_{thr} = 10\log_{10}\left[\frac{1}{2}M_a q_{thr}^2\right]. \quad (16)$$

In one embodiment, if the limiter is enabled to limit a port velocity q at a sampling time t, the static gain computation unit 330 determines an instantaneous gain $G_{static}$ to apply at the sampling time t to limit the port velocity q at the sampling time t in accordance with equations (17)-(18) provided below:

$$G_{static} = 0 \text{ if } E \leq E_{lim} \quad (17), \text{ and}$$

$$G_{static} = E_{lim} - E \text{ if } E_{lim} < E. \quad (18)$$

In one embodiment, if the limiter is enabled to limit and compress a port velocity q at a sampling time t, the static gain computation unit 330 determines an instantaneous gain $G_{static}$ to apply at the sampling time t to limit and compress the port velocity q at the sampling time t in accordance with equations (19)-(22) provided below:

$$G_{static} = 0 \text{ if } E \leq E_{thr} - \frac{W_{knee}}{2}, \quad (19)$$

$$G_{static} = \frac{\left(E - E_{thr} + \frac{W_{knee}}{2}\right)^2\left(\frac{1}{R} - 1\right)}{2W_{knee}} \quad (20)$$

$$\text{if } E_{thr} - \frac{W_{knee}}{2} < E \leq E_{thr} + \frac{W_{knee}}{2},$$

$$G_{static} = (E - E_{thr})\left(\frac{1}{R} - 1\right) \quad (21)$$

$$\text{if } E_{thr} + \frac{W_{knee}}{2} < E \leq E_{lim}, \text{ and}$$

$$G_{static} = E_{lim} - E \text{ if } E_{lim} < E. \quad (22)$$

In one embodiment, the port velocity limiter system 200 comprises a temporal gain smoothing unit 340 configured to implement temporal gain smoothing (i.e., gain attenuation). Specifically, the temporal gain smoothing unit 340 is configured to: (1) receive, as inputs, an instantaneous gain $G_{static}$ at a sampling time t (e.g., from the static gain computation unit 330), an optional set of attack parameters for reducing the gain $G_{static}$ (i.e., attack), and an optional set of release parameters for increasing the gain $G_{static}$ (i.e., release), and (2) apply a smoothing algorithm to the gain $G_{static}$ to reduce or prevent rapid changes in the gain $G_{static}$ that can adversely affect perceived sound quality, resulting in a smoothed gain $G_{smoothed}$.

In one embodiment, the temporal gain smoothing unit 340 is configured to apply any type of smoothing algorithm. For example, as described in detail later herein, in one embodiment, the smoothing algorithm applied involves adjusting the gain $G_{static}$ exponentially utilizing the set of attack parameters and/or the set of release parameters.

In one embodiment, the port velocity limiter system 200 comprises a look-ahead delay unit 350 configured to: (1) receive an input voltage u at a sampling time t, and (2) implement a look-ahead delay by delaying the input voltage u for a predetermined amount of time (e.g., a small delay, such as 20 ms) to allow for temporal gain smoothing (e.g., implemented by the temporal gain smoothing unit 340). Delaying the input voltage u allows for gain attenuation before a port velocity q exceeds a port velocity compression threshold $q_{thr}$.

In one embodiment, the port velocity limiter system 200 comprises a component 360 configured to receive, as inputs, a smoothed gain $G_{smoothed}$ to apply at a sampling time t (e.g., from the temporal gain smoothing unit 340), and an input voltage u at the sampling time t (e.g., from the look-ahead delay unit 350 if look-ahead delay is implemented). The component 360 is configured to attenuate the input voltage u by applying the smoothed gain $G_{smoothed}$ to the input voltage u, resulting in a limited voltage $u_{lim}$ at the sampling time t that limits (and compresses, in some embodiments) port energy $E_{port}$ at the sampling time t and in turn limits (and compresses, in some embodiments) port velocity q to within a predetermined range $[-q_{lim}, q_{lim}]$ at the sampling time t.

Figure 7:
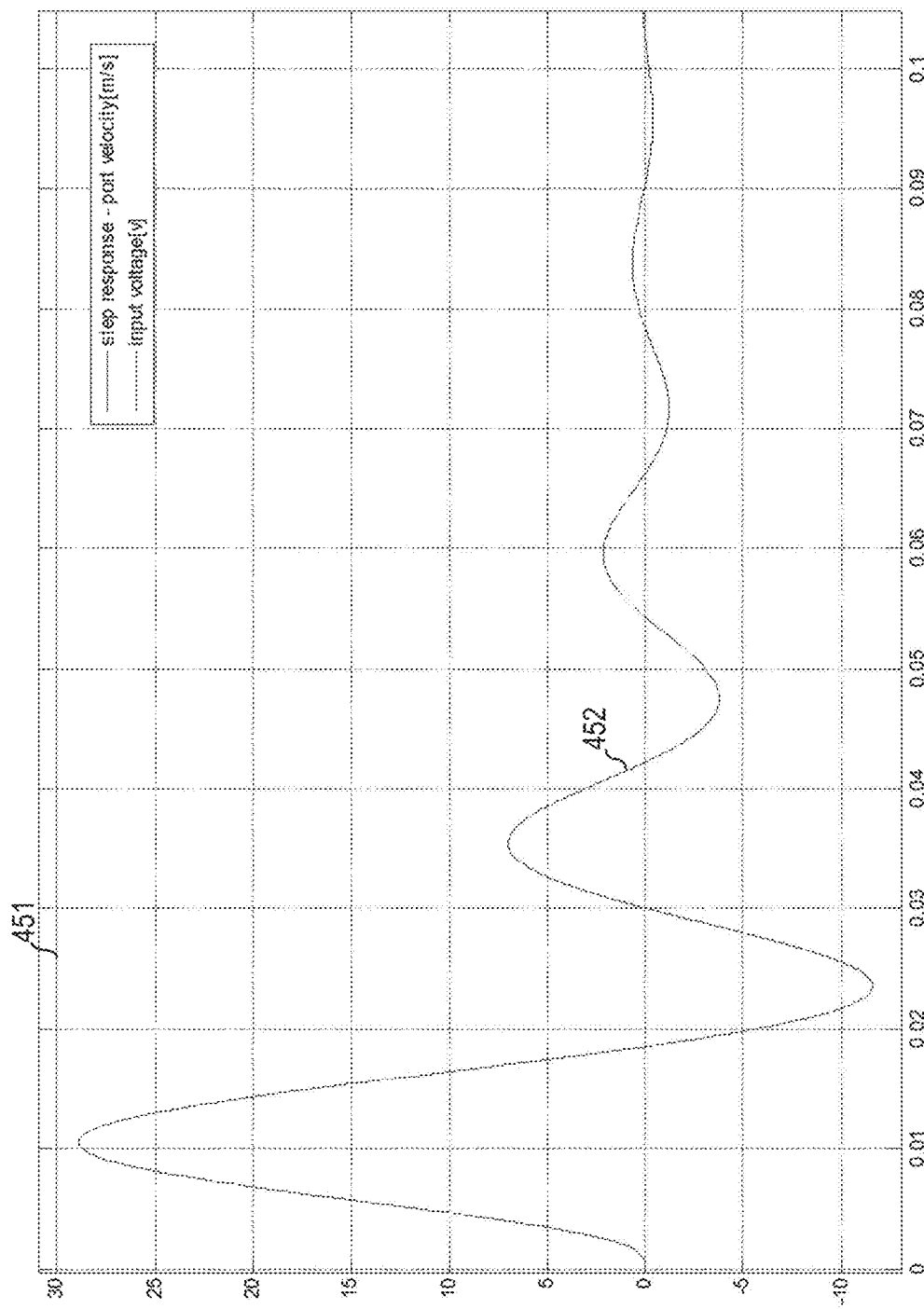
FIG. 7 is an example graph illustrating step response of port velocity to input voltage.

FIG. 7 is an example graph 450 illustrating step response of port velocity to input voltage. A horizontal axis of the graph 450 represents time in s. The graph 450 comprises a first curve 451 representing an input voltage in V, and a second curve 452 representing port velocity in m/s. As shown in FIG. 7, the port velocity takes some time to react to a change in voltage. To provide some time for gain attenuation before a port velocity q exceeds a port velocity compression threshold $q_{thr}$, the port velocity limiter system 200 implements a look-ahead delay (e.g., via the look-ahead delay unit 350) to delay an input voltage u.

Figure 8A:
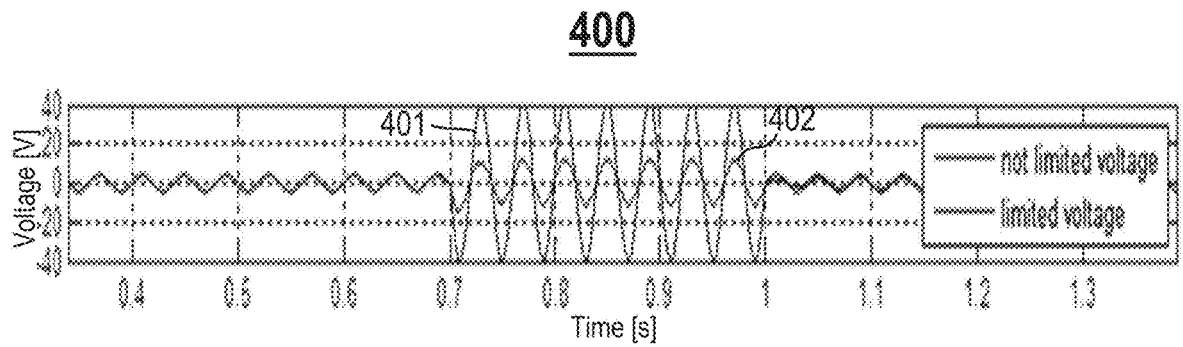
FIG. 8A is an example graph comparing voltage when a limiter provided by the port velocity limiter system in FIG. 6 is enabled with voltage when the limiter is not enabled, in accordance with an embodiment.

FIG. 8A is an example graph 400 comparing voltage when the limiter is enabled with voltage when the limiter is not enabled, in accordance with an embodiment. A horizontal axis of the graph 400 represents time in s. A vertical axis of the graph 400 represents voltage in V. The graph 400 comprises a first curve 401 representing an actual voltage driving the speaker driver 65 when the limiter is not enabled (i.e., actual voltage u* is not limited and is substantially about input voltage u), and a second curve 402 representing an actual voltage driving the speaker driver 65 when the limiter is enabled (i.e., actual voltage u* is limited to substantially about limited voltage $u_{lim}$). If the limiter is enabled, the actual voltage driving the speaker driver 65 is limited, as shown in FIG. 8A.

Figure 8B:
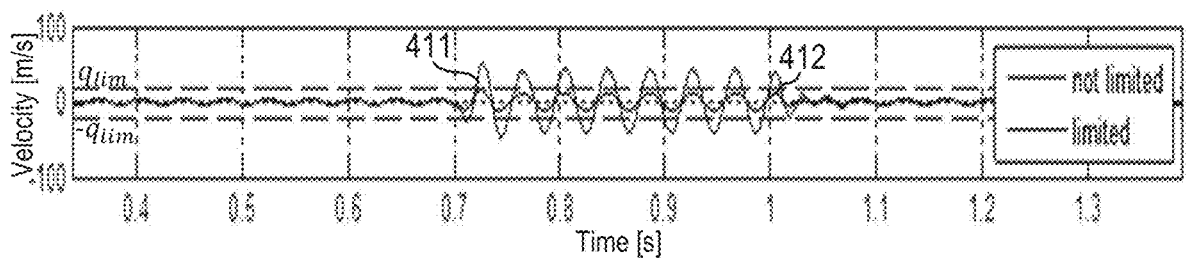
FIG. 8B is an example graph comparing port velocity when the limiter is enabled with port velocity when the limiter is not enabled, in accordance with an embodiment.

FIG. 8B is an example graph 410 comparing port velocity when the limiter is enabled with port velocity when the limiter is not enabled, in accordance with an embodiment. A horizontal axis of the graph 410 represents time in s. A vertical axis of the graph 410 represents port velocity in m/s. The graph 410 comprises a first curve 411 representing port velocity when the limiter is not enabled (i.e., port velocity is not limited), and a second curve 412 representing port velocity when the limiter is enabled (i.e., port velocity is limited). If the limiter is enabled, the port velocity limiter system 200 limits the port velocity to within a predetermined range $[-q_{lim}, q_{lim}]$, as shown in FIG. 8B. For example, if $q_{lim}$ is 18 m/s, the port velocity limiter system 200 applies a gain that limits the port velocity to within a range [−18, 18], as shown in FIG. 8B.

Figure 8C:
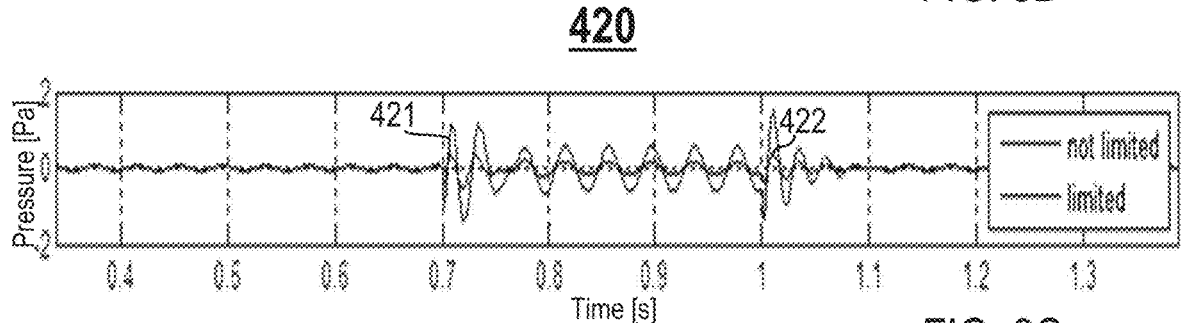
FIG. 8C is an example graph comparing sound pressure when the limiter is enabled with sound pressure when the limiter is not enabled, in accordance with an embodiment.

FIG. 8C is an example graph 420 comparing sound pressure when the limiter is enabled with sound pressure when the limiter is not enabled, in accordance with an embodiment. A horizontal axis of the graph 420 represents time in s. A vertical axis of the graph 420 represents sound pressure in Pascals (Pa). The graph 420 comprises a first curve 421 representing sound pressure in the vented box loudspeaker system when the limiter is not enabled (i.e., sound pressure is not limited), and a second curve 422 representing sound pressure in the vented box loudspeaker system when the limiter is enabled (i.e., sound pressure is limited). If the limiter is enabled, the sound pressure in the vented box loudspeaker system is limited, as shown in FIG. 8C.

Figure 8D:
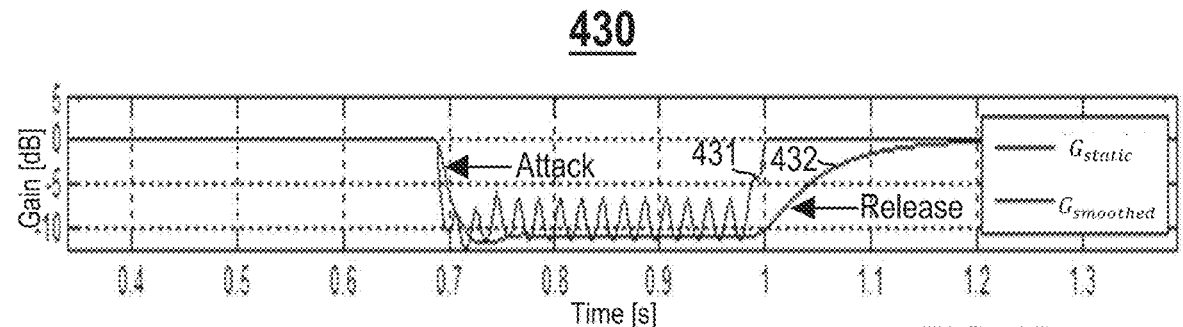
FIG. 8D is an example graph comparing gain $G_{static}$ with smoothed gain $G_{smoothed}$, in accordance with an embodiment.

FIG. 8D is an example graph 430 comparing gain $G_{static}$ with smoothed gain $G_{smoothed}$, in accordance with an embodiment. A horizontal axis of the graph 430 represents time in s. A vertical axis of the graph 430 represents gain in dB. The graph 430 comprises a first curve 431 representing static gain $G_{static}$, and a second curve 432 representing smoothed gain $G_{smoothed}$. In one embodiment, the smoothing algorithm applied by the port velocity limiter system 200 involves adjusting an instantaneous gain $G_{static}$ exponentially utilizing a set of attack parameters and/or a set of release parameters. As shown in FIG. 8D, if there is a step change in the gain $G_{static}$ from a high gain value $G_{high}$ to a low gain value $G_{low}$, the port velocity limiter system 200 reduces the gain $G_{static}$ (i.e., attack) exponentially utilizing the set of attack parameters, resulting in a smoothed gain $G_{smoothed}$ that is represented in accordance with equation (23) provided below:

$$G_{smoothed} = (G_{high} - G_{low})e^{-t/\tau_{attack}} + G_{low} \qquad (23),$$

wherein $\tau_{attack}$ is a time constant representing an amount of time it takes for the gain $G_{static}$ to get within 36.8% of the smoothed gain $G_{smoothed}$.

As further shown in FIG. 8D, if there is a step change in the gain $G_{static}$ from the low gain value $G_{low}$ to the high gain value $G_{high}$, the port velocity limiter system 200 increases the gain $G_{static}$ (i.e., release) exponentially utilizing the set of release parameters, resulting in a smoothed gain $G_{smoothed}$ that is represented in accordance with equation (24) provided below:

$$G_{smoothed} = (G_{high} - G_{low})(1 - e^{-t/\tau_{release}}) + G_{low} \qquad (24),$$

wherein $\tau_{release}$ is a time constant representing an amount of time it takes for the gain $G_{static}$ to get within 36.8% of the smoothed gain $G_{smoothed}$.

In one embodiment, $\tau_{attack}$ is 10 ms, $\tau_{release}$ is 50 ms, and the look-ahead delay is 3 ms. In one embodiment, $\tau_{attack}$, $\tau_{release}$, and the look-ahead delay have different values for different implementations.

Figure 9A:
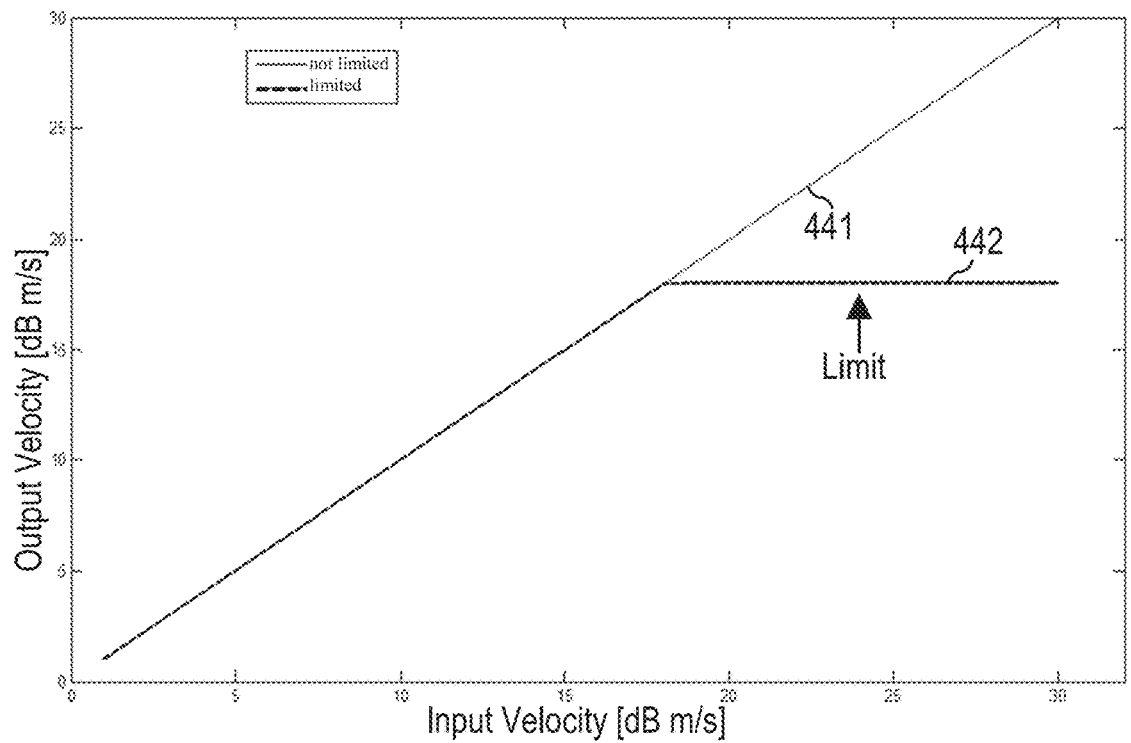
FIG. 9A is an example graph comparing port velocity when the limiter is enabled to limit port velocity with port velocity when the limiter is not enabled, in accordance with an embodiment.

FIG. 9A is an example graph 440 comparing port velocity when the limiter is enabled to limit port velocity with port velocity when the limiter is not enabled, in accordance with an embodiment. A horizontal axis of the graph 440 represents an input velocity (i.e., an estimated port velocity based on an input voltage u, one or more loudspeaker parameters for the vented box loudspeaker device 60, and a physical model of the vented box loudspeaker device 60) in dB m/s. A vertical axis of the graph 440 represents an output velocity (i.e., actual port velocity) in dB m/s. The graph 440 comprises a first curve 441 representing an output velocity when the limiter is not enabled, and a second curve 442 representing an output velocity when the limiter is enabled to limit port velocity. If a predetermined port velocity limit $q_{lim}$ is 8.0 m/s (18.1 dB m/s), the port velocity limiter system 200 with the limiter enabled to limit port velocity applies an instantaneous gain that limits an output velocity, as shown by the second curve 442 in FIG. 9A.

Figure 9B:
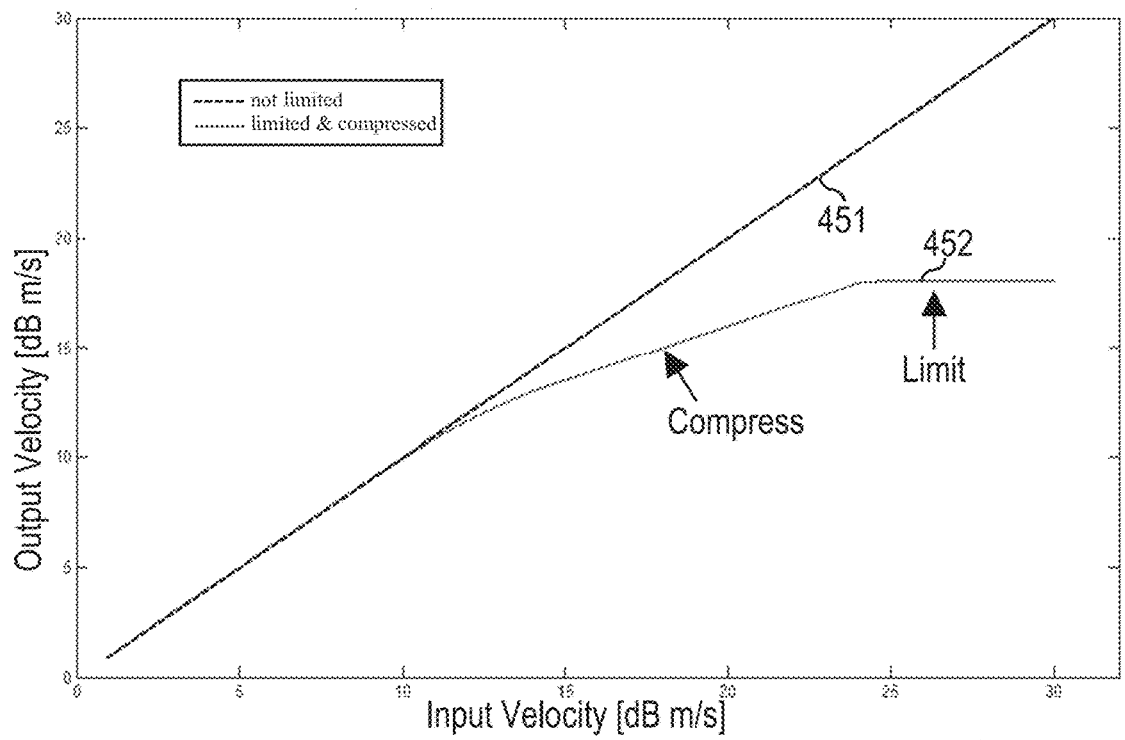
FIG. 9B is an example graph comparing port velocity when the limiter is enabled to limit and compress port velocity with port velocity when the limiter is not enabled, in accordance with an embodiment.

FIG. 9B is an example graph 450 comparing port velocity when the limiter is enabled to limit and compress port velocity with port velocity when the limiter is not enabled, in accordance with an embodiment. A horizontal axis of the graph 450 represents an input velocity (i.e., an estimated port velocity based on an input voltage u, one or more loudspeaker parameters for the vented box loudspeaker device 60, and a physical model of the vented box loudspeaker device 60) in dB m/s. A vertical axis of the graph 450 represents an output velocity (i.e., actual port velocity) in dB m/s. The graph 450 comprises a first curve 451 representing an output velocity when the limiter is not enabled, and a second curve 452 when the limiter is enabled to limit and compress port velocity. If a predetermined port velocity limit $q_{lim}$ is 8.0 m/s (18.1 dB m/s), a predetermined port velocity compression threshold $q_{thr}$ is 4.0 m/s (12.0 dB m/s), a predetermined compression ratio R is 2:1, and a predetermined soft knee width $W_{knee}$ is 6 dB m/s, the port velocity limiter system 200 with the limiter enabled to limit and compress port velocity applies an instantaneous gain that compresses and then limits an output velocity, as shown by the second curve 452 in FIG. 9B.

Figure 10:
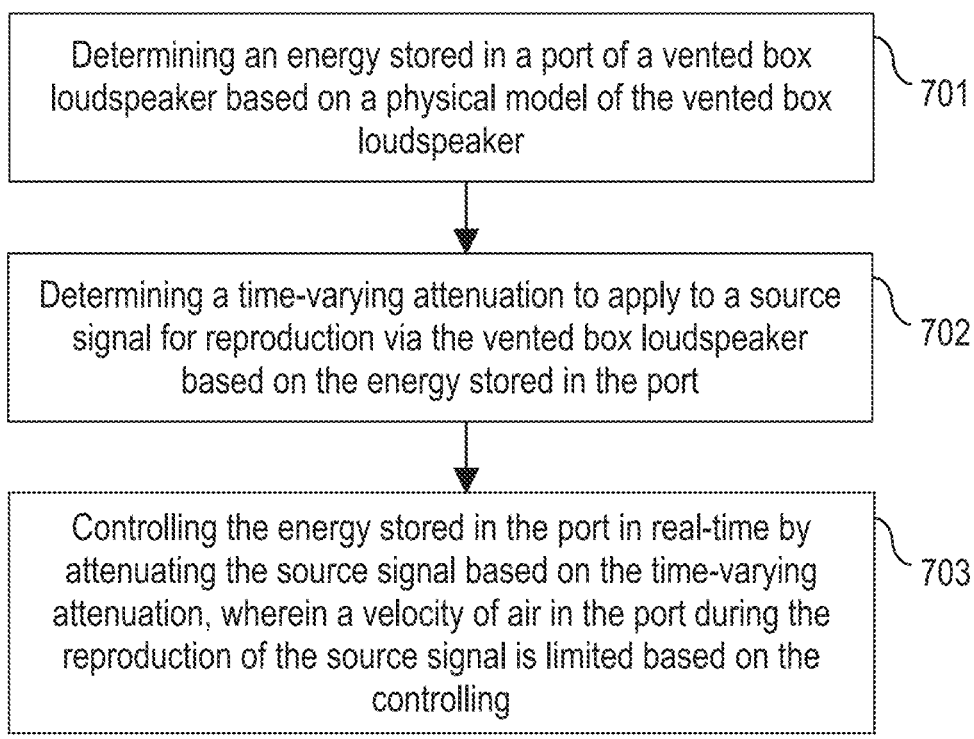
FIG. 10 is an example flowchart of a process for limiting velocity of air in a port of a vented box loudspeaker, in accordance with an embodiment.

FIG. 10 is an example flowchart of a process 700 for limiting velocity of air in a port of a vented box loudspeaker, in accordance with an embodiment. Process block 701 includes determining an energy stored in a port (e.g., port 54) of a vented box loudspeaker (e.g., vented box loudspeaker device 60) based on a physical model of the vented box loudspeaker (e.g., a linear state-space model or a nonlinear state-space model). Process block 702 includes determining a time-varying attenuation to apply to a source signal for reproduction via the vented box loudspeaker based on the energy stored in the port. Process block 703 includes controlling the energy stored in the port in real-time by attenuating the source signal based on the time-varying attenuation, wherein a velocity of air in the port during the reproduction of the source signal is limited based on the controlling.

In one embodiment, one or more components of the port velocity limiter system 200, such as the loudspeaker model unit 310, the energy computation unit 320, the static gain computation unit 330, the temporal gain smoothing unit 340, the look-ahead delay unit 350, and/or the component 360, are configured to perform process blocks 701-703.

Figure 11:
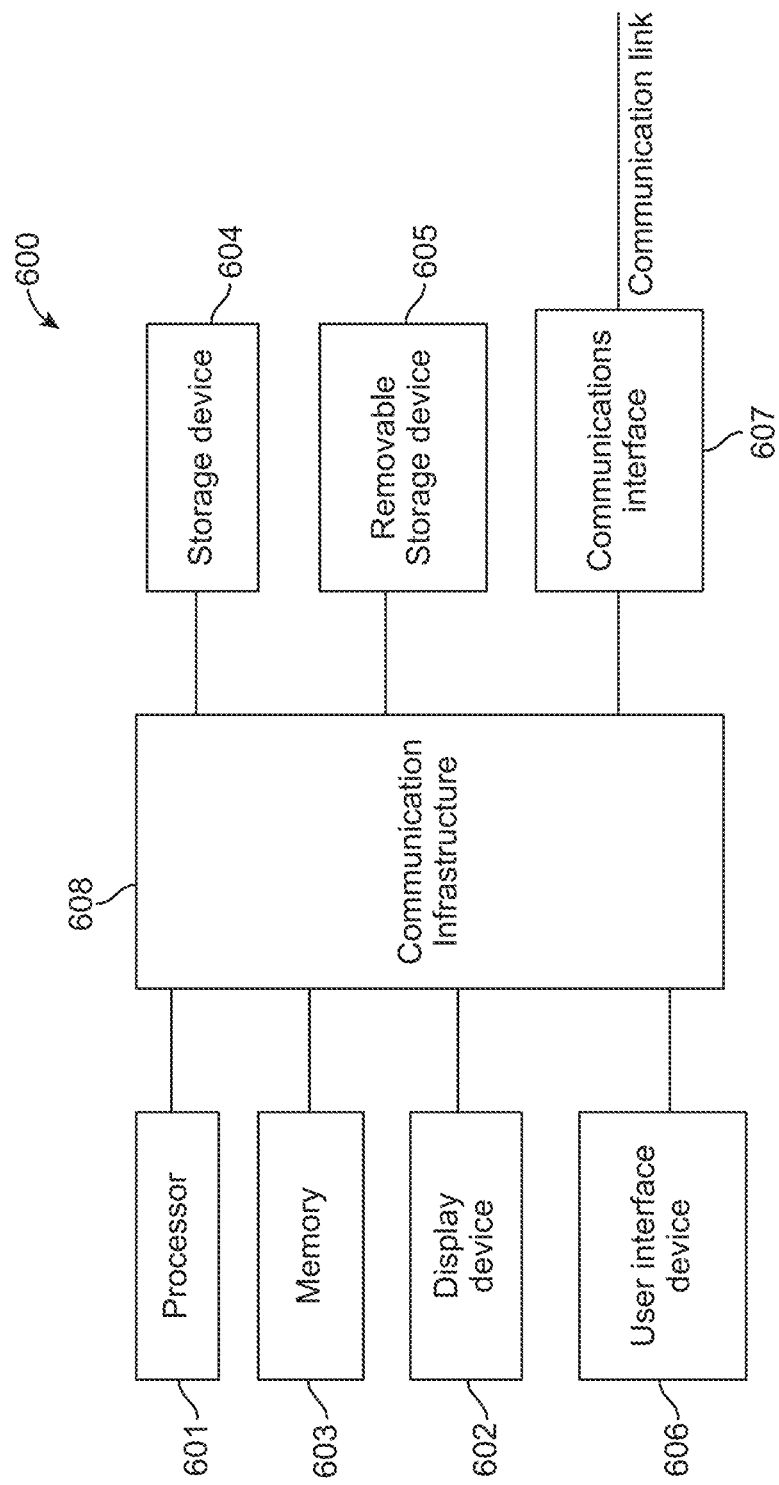
FIG. 11 is a high-level block diagram showing an information processing system comprising a computer system useful for implementing various disclosed embodiments.

FIG. 11 is a high-level block diagram showing an information processing system comprising a computer system 600 useful for implementing various disclosed embodiments. The computer system 600 includes one or more processors 601, and can further include an electronic display device 602 (for displaying video, graphics, text, and other data), a main memory 603 (e.g., random access memory (RAM)), storage device 604 (e.g., hard disk drive), removable storage device 605 (e.g., removable storage drive, removable memory module, a magnetic tape drive, optical disk drive, computer readable medium having stored therein computer software and/or data), user interface device 606 (e.g., keyboard, touch screen, keypad, pointing device), and a communication interface 607 (e.g., modem, a network interface (such as an Ethernet card), a communications port, or a PCMCIA slot and card).

The communication interface 607 allows software and data to be transferred between the computer system 600 and external devices. The nonlinear controller 600 further includes a communications infrastructure 608 (e.g., a communications bus, cross-over bar, or network) to which the aforementioned devices/modules 601 through 607 are connected.

Information transferred via the communications interface 607 may be in the form of signals such as electronic, electromagnetic, optical, or other signals capable of being received by communications interface 607, via a communication link that carries signals and may be implemented using wire or cable, fiber optics, a phone line, a cellular phone link, a radio frequency (RF) link, and/or other communication channels. Computer program instructions representing the block diagrams and/or flowcharts herein may be loaded onto a computer, programmable data processing apparatus, or processing devices to cause a series of operations performed thereon to produce a computer implemented process. In one embodiment, processing instructions for process 700 (FIG. 10) may be stored as program instructions on the memory 603, storage device 604, and/or the removable storage device 605 for execution by the processor 601.

Embodiments have been described with reference to flowchart illustrations and/or block diagrams of methods, apparatus (systems), and computer program products. In some cases, each block of such illustrations/diagrams, or combinations thereof, can be implemented by computer program instructions. The computer program instructions when provided to a processor produce a machine, such that the instructions, which executed via the processor create means for implementing the functions/operations specified in the flowchart and/or block diagram. Each block in the flowchart/block diagrams may represent a hardware and/or software module or logic. In alternative implementations, the functions noted in the blocks may occur out of the order noted in the figures, concurrently, etc.

The terms "computer program medium," "computer usable medium," "computer readable medium," and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Computer program instructions may be stored in a computer readable medium that can direct a computer, other programmable data processing apparatuses, or other devices to function in a particular manner, such that the instructions stored in the computer readable medium produce an article of manufacture including instructions which implement the function/act specified in the flowchart and/or block diagram block(s).

As will be appreciated by one skilled in the art, aspects of the embodiments may be embodied as a system, method or computer program product. Accordingly, aspects of the embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the embodiments may take the form of a computer program product embodied in one or more computer readable medium(s) having computer readable program code embodied thereon.

Any combination of one or more computer readable medium(s) may be utilized. The computer readable medium may be a computer readable storage medium (e.g., a non-transitory computer readable storage medium). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of one or more embodiments may be written in any combination of one or more programming languages, including an object oriented programming language such as Java, Smalltalk, C++, or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In some cases, aspects of one or more embodiments are described above with reference to flowchart illustrations and/or block diagrams of methods, apparatuses (systems), and computer program products. In some instances, it will be understood that each block of the flowchart illustrations and/or block diagrams, and combinations of blocks in the flowchart illustrations and/or block diagrams, can be implemented by computer program instructions. These computer program instructions may be provided to a special purpose computer, or other programmable data processing apparatus to produce a machine, such that the instructions, which execute via the processor of the computer or other programmable data processing apparatus, create means for implementing the functions/acts specified in the flowchart and/or block diagram block(s).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block(s).

The computer program instructions may also be loaded onto a computer, other programmable data processing apparatuses, or other devices to cause a series of operational steps to be performed on the computer, other programmable apparatuses, or other devices to produce a computer implemented process such that the instructions which execute on the computer or other programmable apparatuses provide processes for implementing the functions/acts specified in the flowchart and/or block diagram block(s).

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of pre-AIA 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the invention.

Though the embodiments have been described with reference to certain versions thereof; however, other versions are possible. Therefore, the spirit and scope of the appended claims should not be limited to the description of the preferred versions contained herein.

What is claimed is:

1. A method comprising:
   determining an energy stored in a port of a vented box loudspeaker based on a physical model of the vented box loudspeaker;
   determining a time-varying attenuation to apply to a source signal for reproduction via the vented box loudspeaker based on the energy stored in the port; and
   limiting velocity of air in the port during the reproduction of the source signal by controlling the energy stored in the port in real-time, wherein the controlling comprises attenuating the source signal based on the time-varying attenuation.

2. The method of claim 1, wherein the physical model is a linear model.

3. The method of claim 1, wherein the physical model is a nonlinear model.

4. The method of claim 1, further comprising:
   recursively determining at least one of an estimated displacement of a diaphragm of an active speaker driver of the vented box loudspeaker, an estimated velocity of the diaphragm, an estimated current flowing through a driver voice coil of the speaker driver, an estimated velocity of the air in the port, and an estimated sound pressure in the vented box loudspeaker based on the physical model of the vented box loudspeaker and a voltage of the source signal.

5. The method of claim 1, wherein the attenuating comprises:
   determining an instantaneous gain based on the energy stored in the port and a set of parameters;
   attenuating the gain by applying a smoothing algorithm to the gain; and
   applying the attenuated gain to a voltage of the source signal.

6. The method of claim 5, wherein the smoothing algorithm involves adjusting the gain exponentially utilizing at least one of an attack parameter or a release parameter.

7. The method of claim 1, wherein the velocity of the air in the port during the reproduction of the source signal is limited and compressed.

8. The method of claim 1, further comprising:
   applying a look-ahead delay to delay a voltage of the source signal to allow for the attenuating.

9. A system comprising:
   a voltage source amplifier connected to a vented box loudspeaker; and
   a limiter connected to the voltage source amplifier, wherein the limiter is configured to:
      determine an energy stored in a port of the vented box loudspeaker based on a physical model of the vented box loudspeaker;
      determine a time-varying attenuation to apply to a source signal for reproduction via the vented box loudspeaker based on the energy stored in the port; and
      limiting velocity of air in the port during the reproduction of the source signal by controlling the energy stored in the port in real-time, wherein the controlling comprises attenuating the source signal based on the time-varying attenuation.

10. The system of claim 9, wherein the physical model is a linear model.

11. The system of claim 9, wherein the physical model is a nonlinear model.

12. The system of claim 9, wherein the attenuating comprises:
   determining an instantaneous gain based on the energy stored in the port and a set of parameters;
   attenuating the gain by applying a smoothing algorithm to the gain; and
   applying the attenuated gain to a voltage of the source signal.

13. The system of claim 9, wherein the velocity of the air in the port during the reproduction of the source signal is limited and compressed.

14. The system of claim 9, wherein the limiter is further configured to:
   applying a look-ahead delay to delay a voltage of the source signal to allow for the attenuating.

15. A loudspeaker device comprising:
   an enclosure comprising a port and an active speaker driver including a diaphragm;
   a voltage source amplifier connected to the speaker driver; and
   a limiter connected to the voltage source amplifier, wherein the limiter is configured to:
      determine an energy stored in the port based on a physical model of the loudspeaker device;
      determine a time-varying attenuation to apply to a source signal for reproduction via the loudspeaker device based on the energy stored in the port; and
      limiting velocity of air in the port during the reproduction of the source signal by controlling the energy stored in the port in real-time, wherein the controlling comprises attenuating the source signal based on the time-varying attenuation.

16. The loudspeaker device of claim 15, wherein the physical model is a linear model.

17. The loudspeaker device of claim 15, wherein the physical model is a nonlinear model.

18. The loudspeaker device of claim 15, wherein the attenuating comprises:
   determining an instantaneous gain based on the energy stored in the port and a set of parameters;
   attenuating the gain by applying a smoothing algorithm to the gain; and
   applying the attenuated gain to a voltage of the source signal.

19. The loudspeaker device of claim 15, wherein the velocity of the air in the port during the reproduction of the source signal is limited and compressed.

20. The loudspeaker device of claim 15, wherein the limiter is further configured to:
   applying a look-ahead delay to delay a voltage of the source signal to allow for the attenuating.

* * * * *